(12) United States Patent
Miyamoto

(10) Patent No.: US 6,600,352 B2
(45) Date of Patent: *Jul. 29, 2003

(54) TIMING SIGNAL GENERATING CIRCUIT

(75) Inventor: Yoshikazu Miyamoto, Kasugai (JP)

(73) Assignee: Fujitsu Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/543,894

(22) Filed: Apr. 6, 2000

(65) Prior Publication Data
US 2002/0075048 A1 Jun. 20, 2002

(30) Foreign Application Priority Data
Jul. 2, 1999 (JP) .......................... 11-189000

(51) Int. Cl.⁷ ................................ H03L 7/00
(52) U.S. Cl. ................ 327/161; 327/109; 327/153; 327/158; 331/DIG. 2; 375/376
(58) Field of Search ............... 327/108–112, 149, 327/150, 153, 156, 158, 160; 326/26–28, 82–88; 307/412; 365/189.07; 331/1 A, DIG. 2; 375/376

(56) References Cited

U.S. PATENT DOCUMENTS

| 5,397,940 | A | * | 3/1995 | Janssen | 326/83 |
| 5,410,262 | A | * | 4/1995 | Kang | 326/21 |
| 5,675,274 | A | * | 10/1997 | Kobayashi et al. | 327/158 |
| 5,717,343 | A | * | 2/1998 | Kwong | 326/27 |
| 5,963,047 | A | * | 10/1999 | Kwong et al. | 326/27 |

* cited by examiner

Primary Examiner—Minh Nguyen
(74) Attorney, Agent, or Firm—Arent Fox Kintner Plotkin & Kahn

(57) ABSTRACT

A circuit, which may be used in a delayed lock loop (DLL) circuit of a semiconductor memory device, for generating a timing signal includes an active circuit, a passive circuit, and a signal transition accelerating circuit. The active circuit sets a first voltage level of the timing signal in response to a clock signal. The passive circuit sets a second voltage level of the timing signal. The signal transition accelerating circuit accelerates transition of the timing signal from the first voltage level to the second voltage level, e.g., from a high level to a low level.

21 Claims, 24 Drawing Sheets

TIMING SIGNAL GENERATING CIRCUIT

BACKGROUND OF THE INVENTION

The present invention relates to a timing signal generating circuit and a variable delay circuit, and more particularly, to a timing signal generating circuit and a variable delay circuit employed in a delay locked loop circuit of a semiconductor memory device.

An LSI device, such as a synchronous DRAM (SDRAM), includes a delay locked loop (DLL) circuit or a phase locked loop (PLL) circuit to generate an internal clock signal. The internal clock signal is generated based on an external clock signal of an external device and used to control the data input timing or data output timing of an internal circuit.

The delay circuit generates the internal clock signal such that it is synchronized with or delayed from an external clock signal in correspondence with changes in the characteristics of the output terminal of the SDRAM. A stub series termination logic (SSTL) interface, which is suitable for high speed processing, is employed as the input/output terminal of the SDRAM. Since the amplitude of the signal generated by the SSTL interface is relatively small, high timing accuracy is required. Jitter of the internal clock signal must be minimized to achieve the timing accuracy. That is, in a DLL circuit, differences in the delay amount of delay elements, which are used to delay the external clock signal, and deviations between a pseudo I/O interface signal generated in the device and an external I/O interface signal must be minimized.

FIG. 1 is a schematic block diagram showing an SDRAM 50. The SDRAM 50 has a memory circuit 51, which includes a data output buffer 52 and a memory circuit block 51a, and a DLL circuit 60. The DLL circuit 60 generates an internal clock signal used to control the output timing of data.

The memory circuit block 51a receives various signals, such as an external clock signal CLK, an external command signal, an address signal, and write data. Based on the external command signal, the memory circuit block 51a performs various processes, such as writing or reading data.

The data output buffer 52 transmits read data RD from the memory circuit block 51a, in accordance with the internal clock signal CK from the DLL circuit 60, to an external input device 54 via an external output terminal 53 of the SDRAM 50 and an SSTL interface 56. The SSTL interface 56 performs level conversion on the theoretical amplitude of the read data RD and generates an external I/O interface signal DQ. The external I/O interface signal DQ is sent to the external input device 54.

FIG. 2 is a circuit diagram showing the data output buffer 52 and the SSTL interface 56. The data output buffer 52 includes a pull-up p-channel (PMOS) transistor Q1 and a pull-down n-channel MOS (NMOS) transistor Q2, which are connected in series between a high potential power supply VDD and a low potential power supply VSS. The read data RD is applied to the gates of the PMOS transistor Q1 and the NMOS transistor Q2 via a transfer gate (not shown), which opens in response to the rising of the internal clock signal CK. The read data RD is output from a node between the PMOS transistor Q1 and the NMOS transistor Q2 and provided to the SSTL interface 56 via the external output terminal 53.

The SSTL interface 56 includes a resistor R1 connected to the external output terminal 53, a pull-up resistor R2 connected to the resistor RI, and a pull-up resistor R3 connected to an external input terminal 55 of the external input device 54. A final voltage VTT is applied to the pull-up resistors R2, R3. A line L is connected to a node between the resistor R1 and the pull-up resistor R2 and a node between the pull-up resistor R3 and the external input terminal 55. The resistor R1 is preferably 25 ohms and the resistors R2, R3 are preferably 50 ohms.

The SSTL interface 56 generates the external I/O interface signal DQ (FIG. 8), which amplitude is smaller than the theoretical amplitude of the read data RD, and sends the external I/O interface signal DQ to the external input terminal 55. An input buffer 54a of the external input device 54 compares the external I/O interface signal DQ to a reference signal VREF and generates a waveform-shaped external I/O interface signal.

As shown in FIG. 1, the DLL circuit 60 includes a clock input buffer 61, a delay circuit section 62, a pseudo interface circuit section 63, a pseudo signal input buffer 64, a determination circuit section 65, and a delay control circuit section 66.

The clock input buffer 61 receives the external clock signal CLK from an external device (not shown) and compares the clock signal CLK with the reference signal VREF to generate a waveform-shaped external clock signal WCLK. The clock input buffer 61 causes the waveform-shaped external clock signal WCLK to go high when the external clock signal CLK becomes equal to or higher than the reference signal VREF and causes the waveform-shaped external clock signal WCLK to go low when the external clock signal CLK becomes lower than the reference signal VREF.

The delay circuit section 62 receives the waveform-shaped external clock signal WCLK and delays it for a predetermined time in accordance with a control signal from the delay control circuit section 66 to generate the internal clock signal CK.

FIG. 6 is a circuit diagram showing the delay circuit section 62, which has a plurality (an n number) of delay circuits DM1–DMn that are connected in series. A high potential power supply VDD and a low potential power supply VSS are applied to each of the delay circuits DM1–DMn via power supply lines Lp, Ln.

The first delay circuit DM1 receives the waveform-shaped external clock signal WCLK from the clock input buffer 61 and sends a delayed clock signal to the next delay circuit DM2 and so on. In this manner, the waveform-shaped external clock signal WCLK is sequentially delayed as it is passed on to the subsequent delay circuits. Thus, the delay between the external clock signal CLK and the delayed clock signal increases at each delay circuit DMn.

The output terminal of each of the delay circuits DM1–DMn is connected to an internal clock signal output line L2 via gate transistors GT1–GTn, which are preferably NMOS transistors. Selection signals SL1–SLn are received from the delay control circuit section 66 to activate a selected one of the gate transistors GT1–GTn. The delayed clock signal output by the delay circuit DMn corresponding to the activated gate transistor is provided to the internal clock signal output line L2. In other words, the delay circuit DMn selected by the delay control circuit section 66 provides the internal clock signal output line L2 with a delayed clock signal that is delayed by a predetermined time. In this manner, a phase controlled internal clock signal CK is generated. The delayed (phase controlled) internal clock signal CK is sent to the data output buffer 52 and the pseudo interface circuit section 63.

The pseudo interface circuit section 63 receives the internal clock signal CK from the delay circuit section 62, converts the level of the internal clock signal CK, and generates a pseudo I/O interface signal dDQ that is an approximation of the external I/O interface signal DQ provided to the external input device 54. In other words, the pseudo interface circuit section 63 has a transmission characteristic that approximates the transmission characteristic of the SSTL interface 56.

FIG. 4 is a circuit diagram showing the conventional pseudo interface circuit section 63, which includes an output portion 63a and an interface portion 63b. The output portion 63a has a pull-up PMOS transistor Q11 and a pull-down NMOS transistor Q12 connected in series between the high potential power supply VDD and the low potential power supply VSS. The internal clock signal CK is provided to the gate of the PMOS transistor Q11 and the gate of the NMOS transistor Q12.

The circuit configuration of the interface portion 63b is equivalent to that of the SSTL interface 56 shown in FIG. 2. An equivalent circuit of the SSTL interface 56 is shown in FIG. 3. This equivalent circuit has a resistor R4, which is preferably 25 ohms, a pull-up resistor R5, which is preferably 25 ohms, and a capacitor C1, which is preferably 30 pF taking into consideration the wire capacitance of the line L.

The interface portion 63b of FIG. 4 has a capacitor C11 and four resistors R11–R14. A voltage divider circuit formed by the resistors R11 and R12 divides the high potential power supply VDD and generates the final voltage VTT. The resistor R13 corresponds to the resistor R4 and receives the internal clock signal CK from the output portion 63a. The resistor R14 corresponds to the pull-up resistor R5 and is provided with the final voltage VTT from the voltage divider circuit. The capacitor C11 corresponds to the wire capacitance of the line L (and the 30 pF capacitor C1) and is connected between the low potential power supply VSS and a node between the resistors R13 and R14.

The pseudo signal input buffer 64 receives the pseudo I/O interface signal dDQ from the pseudo interface circuit section 63, compares the pseudo I/O interface signal dDQ with the reference signal VREF, and generates a waveform-shaped pseudo I/O interface signal WdDQ. The reference signal VREF (determination level) is set at an intermediate level of the theoretical amplitude of the pseudo I/O interface signal dDQ. More specifically, the pseudo signal input buffer 64 causes the waveform-shaped pseudo I/O interface signal WdDQ to go high when the pseudo I/O interface signal dDQ becomes equal to or higher than the reference signal VREF and causes the waveform-shaped pseudo I/O interface signal WdDQ to go low when the pseudo I/O interface signal dDQ becomes lower than the reference signal VREF.

The determination circuit section 65 receives the waveform-shaped pseudo I/O interface signal WdDQ from the pseudo signal input buffer 64 and the waveform-shaped external clock signal WCLK from the clock input buffer 61 to compare the rising of the interface signal WdDQ with the rising of the clock signal WCLK. That is, the determination circuit section 65 compares the phase of the wave-form shaped pseudo I/O interface signal WdDQ with the phase of the clock signal WCLK and provides the comparison result to the delay control circuit section 66.

The delay control circuit section 66 generates the selection signal which activates one of the gate transistors GT1–GTn in the delay circuit section 62 based on the comparison result.

For example, if the waveform-shaped pseudo I/O interface signal WdDQ rises earlier than the clock signal WCLK, the delay control circuit section 66 delays the internal clock signal CK by activating a gate transistor GTn corresponding to the next delay circuit DMn from the currently selected delay circuit. That is, when the phase of the waveform-shaped pseudo I/O interface signal WdDQ is ahead of the waveform-shaped external clock signal WCLK, the delay control circuit section 66 selects the next delay circuit DM in order to delay the phase of the internal clock signal CK.

If the waveform-shaped pseudo I/O interface signal WdDQ rises later than the waveform-shaped external clock signal WCLK, the delay control circuit section 66 advances the internal clock signal CK by activating a gate transistor GT corresponding to a delay circuit DM that is prior to the currently selected delay circuit. That is, when the phase of the waveform-shaped pseudo I/O interface signal WdDQ is delayed from that of the waveform-shaped external clock signal WCLK, the delay control circuit section 66 selects a forward delay circuit DM in order to advance the phase of the internal clock signal CK. In this manner, the internal clock signal CK is generated in cooperation with changes in the characteristics of the output terminal at a timing appropriate for the device 54.

The generation of the final voltage VTT with the voltage divider circuit, which is formed by the resistors R11, R12 in the pseudo interface circuit section 63, increases power consumption. To decrease power consumption, the size of the pseudo interface circuit section 63 may be reduced. However, this results in the pseudo interface circuit section 63 being different from the actual SSTL interface 56 and may consequently increase any deviation between the pseudo I/O interface signal dDQ and the external I/O interface signal DQ.

FIG. 5 is a circuit diagram showing a conventional improved pseudo interface circuit section 71, which has an output portion 71a formed by a PMOS transistor Q3. The source of the PMOS transistor Q3 is connected to the high potential power supply VDD, and the drain of the PMOS transistor Q3 is connected to the pseudo signal input buffer 64. The gate of the PMOS transistor Q3 receives the internal clock signal CK.

The pseudo interface circuit section 71 also has an interface portion 71b, which includes a pull-up resistor R16, a pull-down resistor R17, and a capacitor C12. The pull-up resistor R16 has a first terminal connected to the drain of the PMOS transistor Q3 and a second terminal connected to the high potential power supply VDD. The pull-down resistor R17 and the capacitor C12 each have a first terminal connected to the drain of the PMOS transistor Q3 and a second terminal connected to the low potential power supply VSS.

When the PMOS transistor Q3 is deactivated, the potential Vn1 at node n1 is set at $$Vn1 = VDD\{R17/(R16+R17)\}.$$

Accordingly, the potential Vn1 at the node n1 may be set as required regardless of manufacturing differences of the PMOS transistor Q3.

In the pseudo interface circuit section 71, the pull-down resistor R17 has a relatively high resistance to suppress the through current flowing from the high potential power supply VDD to the low potential power supply VSS. In other words, the values of the resistors R16, R17 are set so that the current flowing through the pull-down resistor R17 is less than the current flowing through the NMOS transistor Q12 of the pseudo interface circuit section 63. Accordingly, the through current from the high potential power supply VDD to the low potential power supply VSS is controlled and power consumption is reduced.

The rising of the waveform of the pseudo I/O interface signal dDQ (the potential Vn1 at the node n1) in the pseudo interface circuit section 71 is substantially the same as the rising of the waveform of the pseudo I/O interface signal dDQ in the pseudo interface circuit section 63.

However, the resistance of the pull-down resistor R17 in the pseudo interface circuit section 71 is relatively greater. Thus, the falling of the waveform of the pseudo I/O interface signal dDQ is more gradual. As a result, an increase in the frequency of the external clock signal CLK makes accurate reproduction by the pseudo signal input buffer 64 difficult. That is, with reference to FIG. 9, due to the gradual falling waveform of the pseudo I/O interface signal dDQ, when the internal clock signal CK rises in accordance with the rising of the next external clock signal CLK, the pseudo I/O interface signal dDQ rises before completely falling to the theoretical amplitude low level. Therefore, with reference to FIG. 10, the time period tPD2 between the level of the pseudo I/O interface signal dDQ and the determination level of the pseudo signal input buffer 64 (reference signal VREF) is shorter than the time period tPD1 between the theoretical low level and the determination level. This decreases the accuracy of the internal clock signal CK and may thus cause jitter.

SUMMARY OF THE INVENTION

It is a first object of the present invention to provide a timing signal generating circuit for generating a highly accurate timing signal.

It is a second object of the present invention to provide a variable delay circuit that controls the phase of the clock signal with high accuracy.

To achieve the above objects, the present invention provides a circuit for generating a timing signal having a first voltage level and a second voltage level. The circuit includes an active circuit for setting the first voltage level of the timing signal in response to a clock signal, a passive circuit for setting the second voltage level of the timing signal, and a signal transition accelerating circuit connected to the active and passive circuits to accelerate transition of the timing signal from the first voltage level to the second voltage level.

Another aspect of the present invention provides a delay locked loop (DLL) circuit for comparing a phase of a timing signal with a phase of an external clock signal, controlling the phase of the external clock signal in accordance with the comparison result, and generating an internal clock signal having a first voltage level and a second voltage level. The DLL circuit includes a timing signal generating circuit for generating a timing signal having a third voltage level and a fourth voltage level from the internal clock signal. The third and fourth voltage levels differ from the first and second voltage levels. The timing signal generating circuit includes an active circuit for setting the third voltage level of the timing signal when the internal clock signal transitions from the first voltage level to the second voltage level, a passive circuit for setting the fourth voltage level of the timing signal when the internal clock signal transitions from the second voltage level to the first voltage level, and a signal transition accelerating circuit connected to the active and passive circuits to accelerate the transition of the timing signal from the third voltage level to the fourth voltage level.

A further aspect of the present invention provides a semiconductor memory device including a delay locked loop (DLL) circuit for generating an internal clock signal having a first voltage level and a second voltage level from an external clock signal. The DLL circuit includes a determination circuit for comparing a phase of a timing signal with a phase of the external clock signal to generate a comparison signal, a delay circuit for delaying the external clock signal in accordance with the comparison signal to generate the internal clock signal, and a timing signal generating circuit connected to the delay circuit to generate the timing signal having a third voltage level and a fourth voltage level from the internal clock signal. The third and fourth voltage levels differ from the first and second voltage levels. The timing signal generating circuit includes an active circuit for setting the third voltage level of the timing signal when the internal clock signal transitions from the first voltage level to the second voltage level, a passive circuit for setting the fourth voltage level of the timing signal when the internal clock signal transitions from the second voltage level to the first voltage level, and a signal transition accelerating circuit connected to the active and passive circuits to accelerate the transition of the timing signal from the third voltage level to the fourth voltage level.

A further aspect of the present invention provides a variable delay circuit including a plurality of delay elements connected between a pair of power supply lines, and a filter element connected to each of the delay elements.

A further aspect of the present invention provides a variable delay circuit including a plurality of delay elements connected between a pair of power supply lines, and a power consumption circuit connected between the pair of power supply lines to consume power when each of the delay elements are inactive.

A further aspect of the present invention provides a variable delay circuit including a plurality of delay elements connected between a pair of power supply lines, a filter element connected to each of the delay elements, and a power consumption circuit connected between the pair of power supply lines to consume power when each of the delay elements are inactive.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
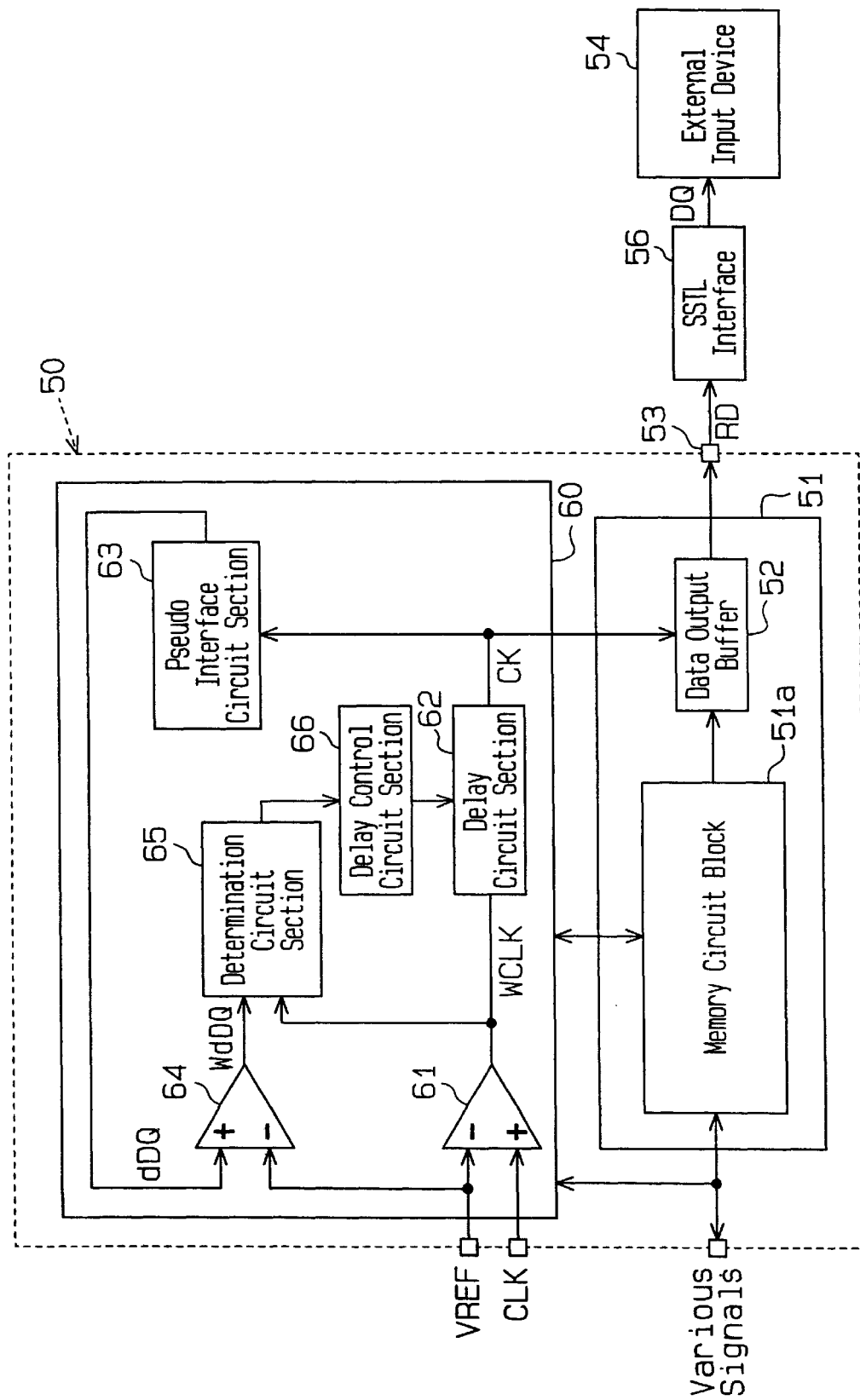
FIG. 1 is a schematic block diagram showing a prior art SDRAM.
Figure 2:
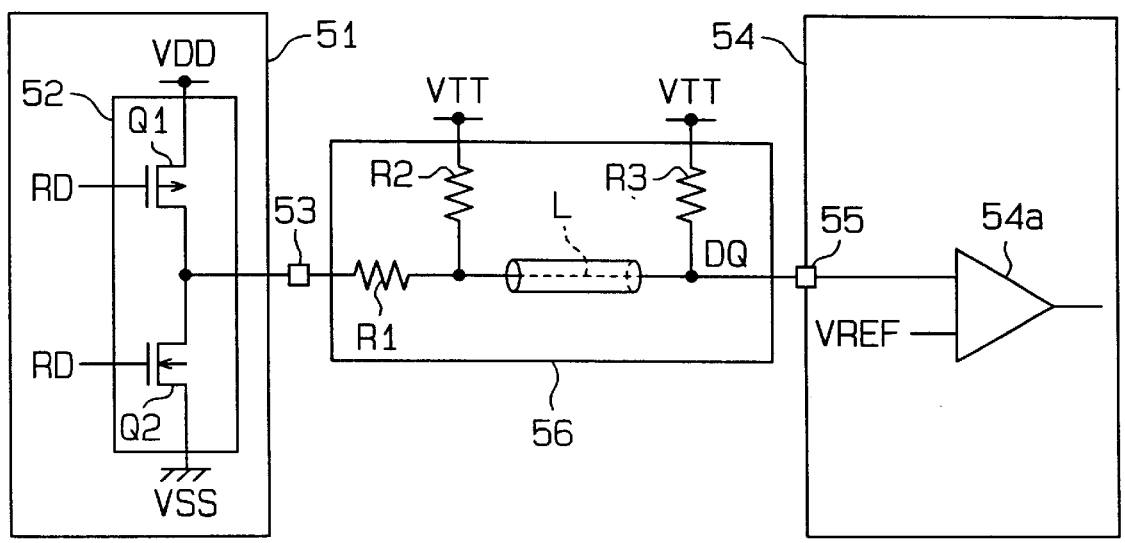
FIG. 2 is a circuit diagram showing an SSTL interface of the SDRAM of FIG. 1.
Figure 3:
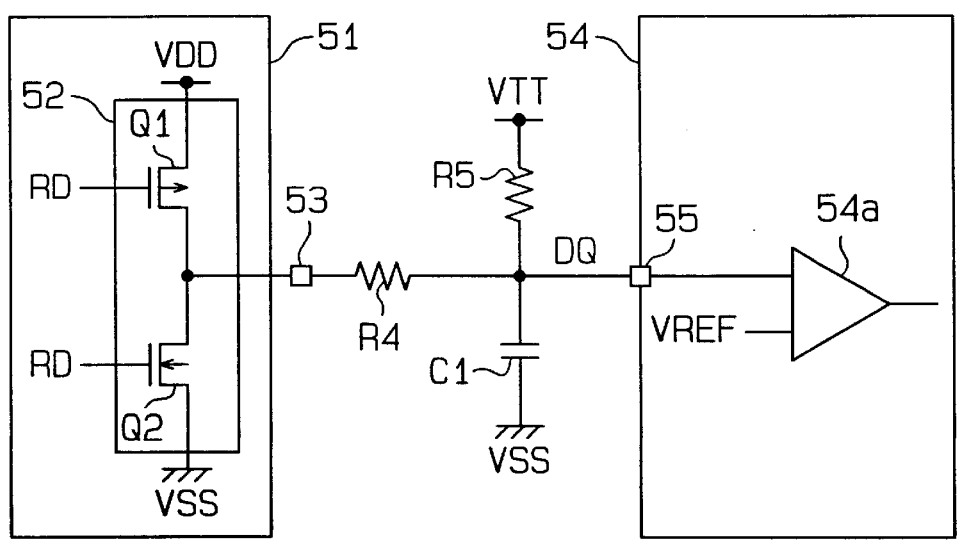
FIG. 3 is a circuit diagram showing an equivalent circuit of the SSTL interface of FIG. 2.
Figure 4:
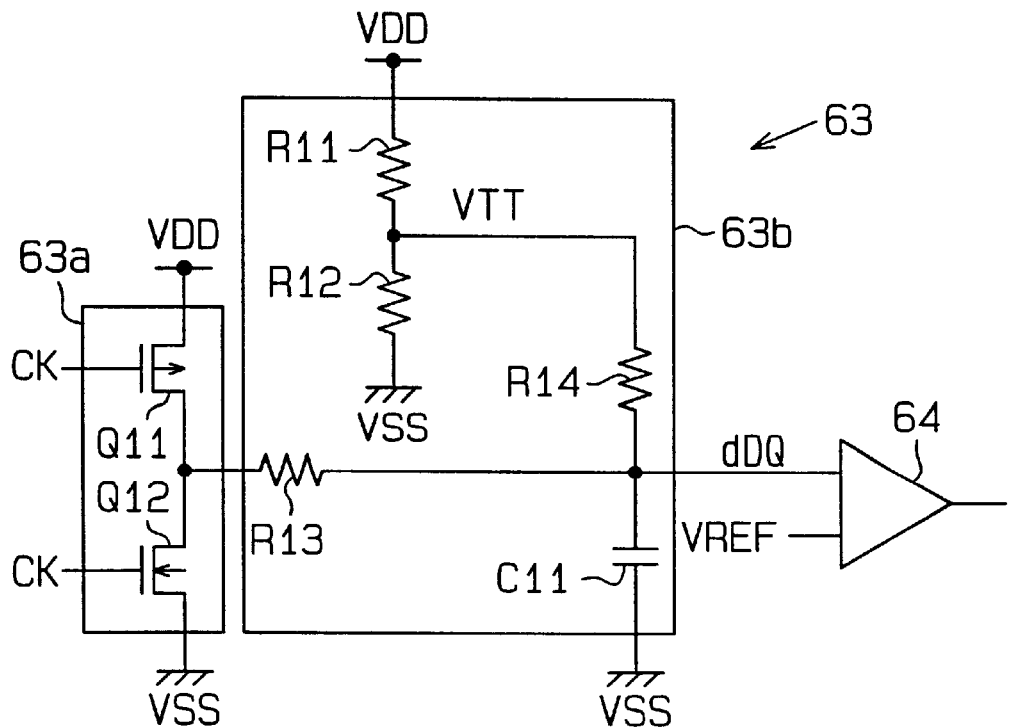
FIG. 4 is a circuit diagram showing a pseudo interface circuit section of the SDRAM of FIG. 1.
Figure 5:
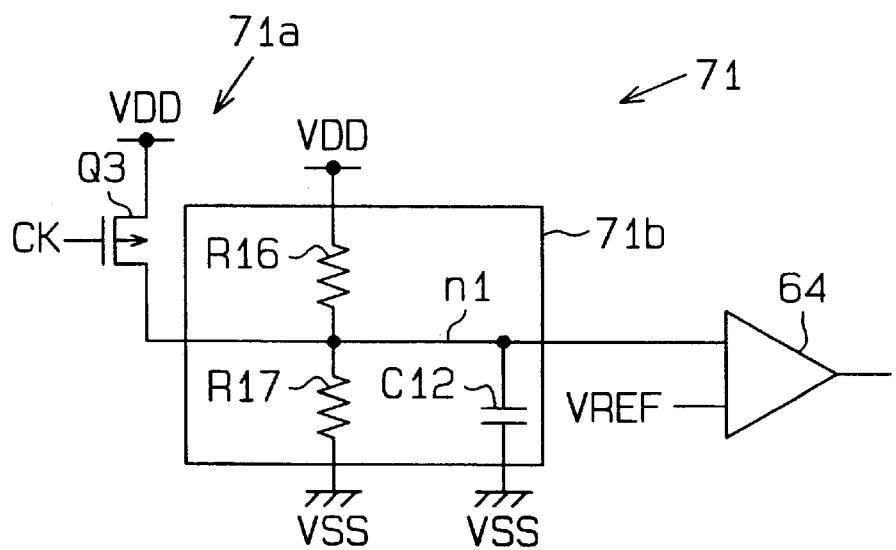
FIG. 5 is a circuit diagram showing a second prior art pseudo interface circuit section.

In the drawings, like numerals are used for like elements throughout.

[First Embodiment]

Figure 13:
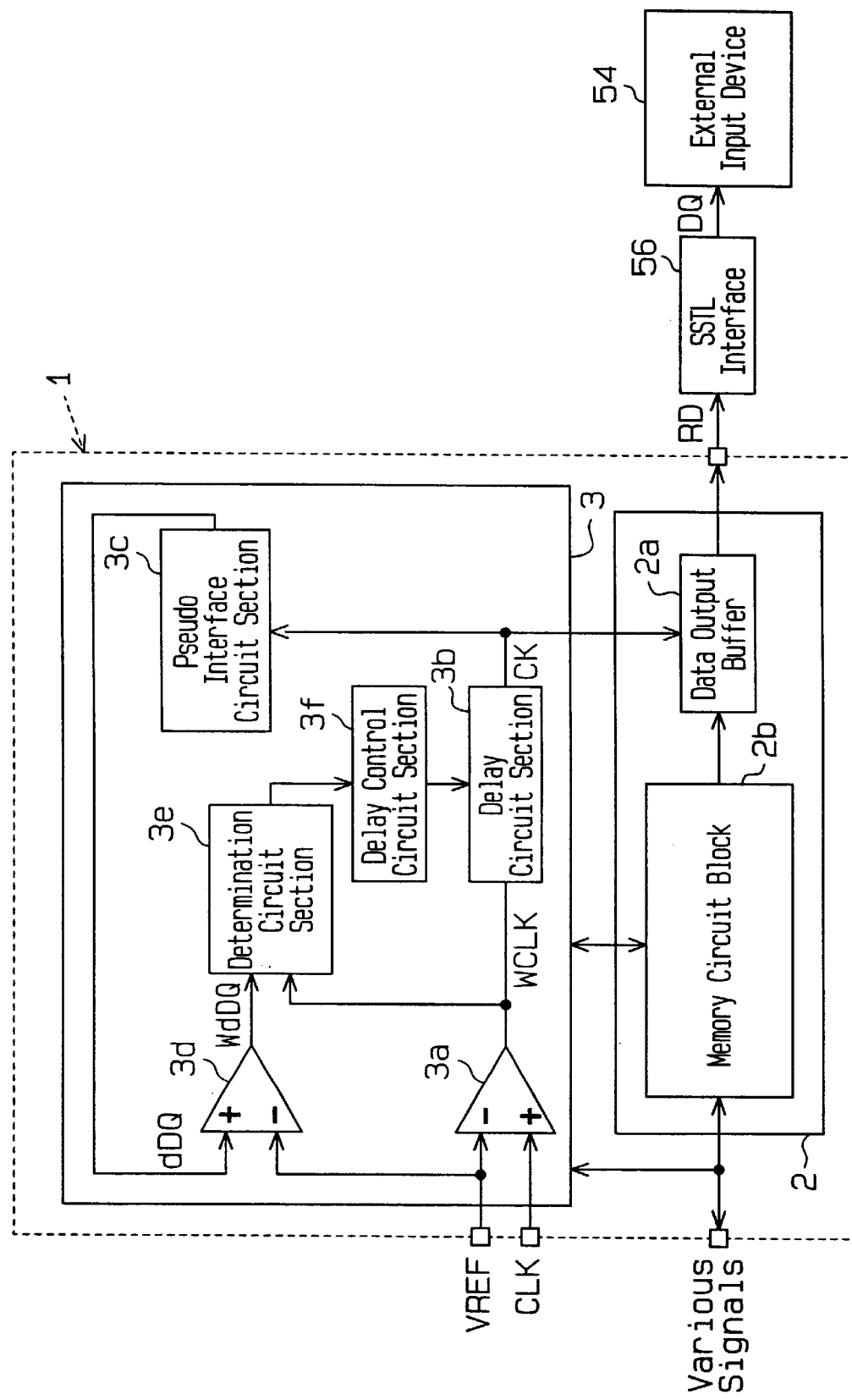
FIG. 13 is a schematic block diagram showing an SDRAM according to a first embodiment of the present invention.

FIG. 13 is a schematic block diagram showing an SDRAM 1 according to a first embodiment of the present invention. The SDRAM 1 has a memory circuit 2 and a DLL circuit 3. The memory circuit 2 includes a data output buffer 2a and a memory circuit block 2b. The DLL circuit 3 includes a clock input buffer 3a, a delay circuit section 3b functioning as a variable delay circuit, a pseudo interface circuit section 3c functioning as a timing signal generating circuit, a pseudo signal input buffer 3d, a determination circuit section 3e, and a delay control circuit section 3f.

The clock input buffer 3a, the pseudo signal input buffer 3d, the determination circuit section 3e, and the delay control circuit section 3f will not be described since they are substantially the same as the conventional clock input buffer 61, the pseudo signal input buffer 64, the determination circuit 65, and the delay control circuit section 66. The delay circuit section 3b and the pseudo interface circuit section 3c will be described.

Figure 14:
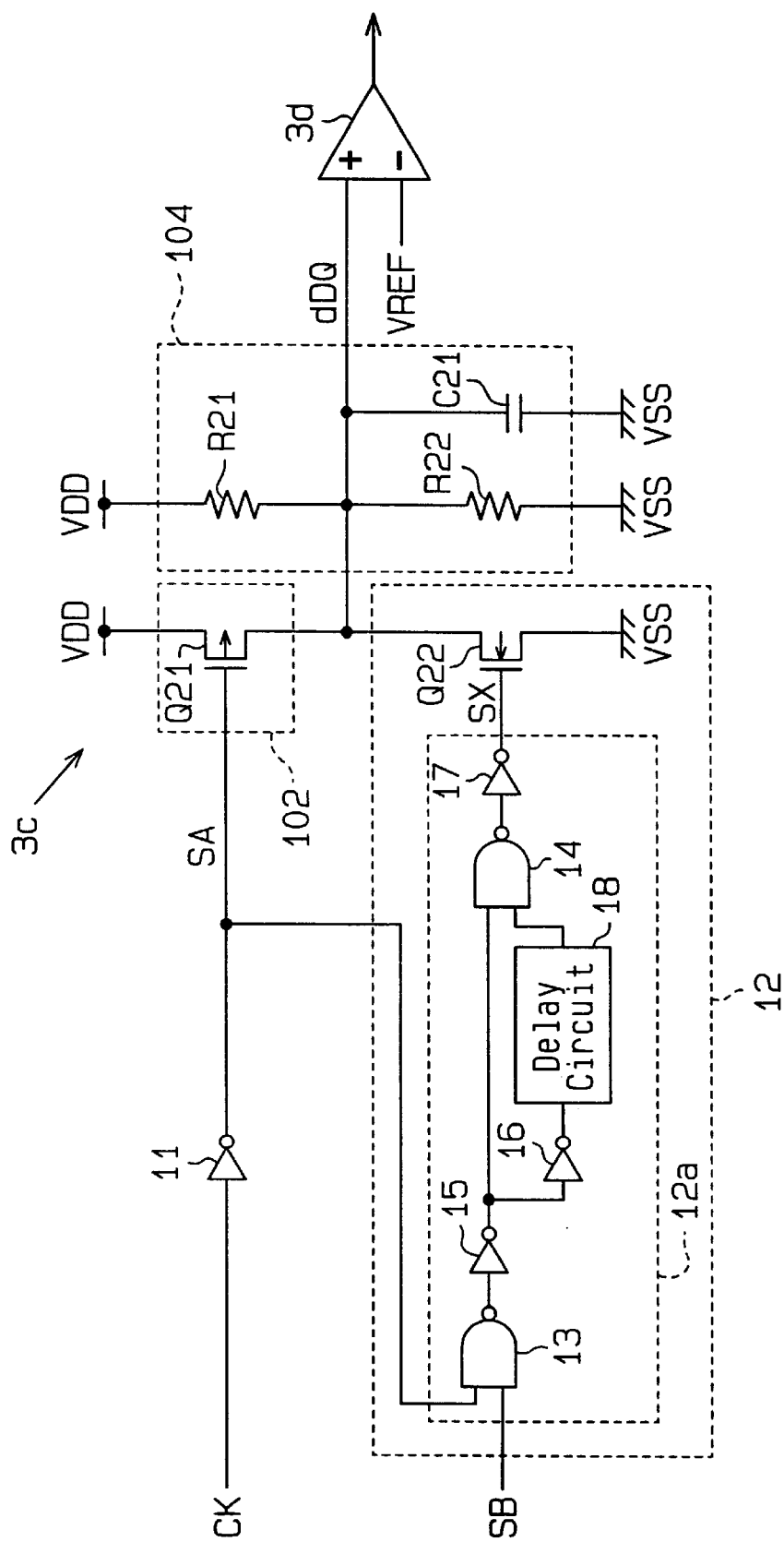
FIG. 14 is a circuit diagram showing the pseudo interface circuit section of the SDRAM of FIG. 13.

FIG. 14 is a circuit diagram showing the pseudo interface circuit section 3c, which includes an output portion 102 having a PMOS transistor Q21 functioning as an active circuit, an interface portion 104, and a signal transition accelerating circuit 12. The source of the PMOS transistor Q21 is connected to a high potential power supply VDD, and the drain of the PMOS transistor Q21 is connected to the signal transition accelerating circuit 12 and the pseudo signal input buffer 3d. The gate of the PMOS transistor Q21 receives an internal clock signal CK from the delay circuit section 3b via an inverter 11. The drive capability of the PMOS transistor Q21 is relatively large. Thus, when the PMOS transistor Q21 is activated, the current flowing into a capacitor C21 of the interface portion 104 increases and causes a pseudo I/O interface signal dDQ, which functions as a timing signal, to go high suddenly.

The interface portion 104 includes resistors R21, R22, which form a dividing circuit that functions as a passive circuit, and the capacitor C21. The resistor R21 has a first terminal connected to the drain of the PMOS transistor Q21 and a second terminal connected to a high potential power supply VDD. The resistor R22 and the capacitor C21 each have a first terminal connected to the drain of the PMOS transistor Q21 and a second terminal connected to a low potential power supply VSS.

The resistors R21, R22 set the theoretical amplitude level of the pseudo I/O interface signal dDQ which approximates the I/O interface signal DQ. Since the resistance values of the resistors R21, R22 are relatively high, the through current flowing through the resistors R21, R22 from the high potential power supply to the low potential power supply is decreased. The capacitor C21 is used to match the load capacitance of the SSTL interface 56.

The signal transition accelerating circuit 12 includes an NMOS transistor Q22 and a discharge control circuit 12a. The drain of the NMOS transistor Q22 is connected to the drain of the PMOS transistor Q21. The source of the NMOS transistor Q22 is connected to the low potential power supply VSS. The gate of the NMOS transistor Q22 receives a control signal SX from the discharge control circuit 12a.

The discharge control circuit 12a includes first and second NAND circuits 13, 14, three inverters 15, 16, 17, and a delay circuit 18. The first NAND circuit 13 receives an inverted internal clock signal SA, which is generated when the inverter 11 inverts the internal clock signal CK, and a standby signal SB from a standby signal generating circuit (not shown) of the SDRAM 1 to generate a first NAND logic signal. The standby signal SB is set at a low level (low potential) when the SDRAM 1 is in a standby state (i.e., when the external clock signal CLK is not received from an external device) and set at a high level (high potential) when the external clock signal CLK is received.

When not in the standby state, the first NAND circuit 13 causes the first NAND logic signal to go low when the inverted internal clock signal SA goes high, which is when the internal clock signal CK goes low. The first NAND logic signal is sent to the second NAND circuit 14 via the first inverter 15 and to the delay circuit 18 via the first and second inverters 15, 16. The delay circuit 18 includes an even number of inverters that delay the first NAND logic signal by a delay time "te" and send a delayed first NAND logic signal to the second NAND circuit 14.

When the first NAND logic signal is low, the second NAND circuit 14 outputs a second NAND logic signal that is maintained at a low level for the time corresponding to the delay time te of the delay circuit 18. The second NAND logic signal is sent to the gate of the NMOS transistor Q22 as the control signal SX via the third inverter 17.

Figure 17:
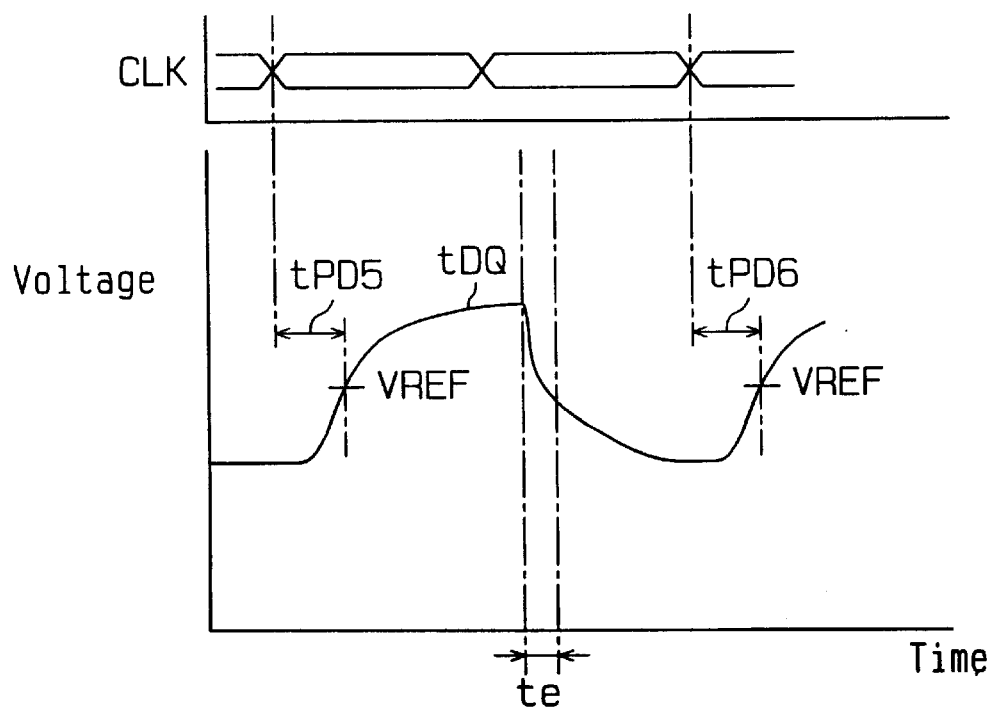
FIG. 17 is a chart showing the waveform of a pseudo I/O interface signal generated by the pseudo interface circuit section of FIG. 14.

The PMOS transistor Q21 is deactivated when the internal clock signal CK goes low, which is when the inverted internal clock signal SA goes high. In this state, since the first NAND logic circuit is low, the control signal SX is maintained at a high level for the delay time te, and the NMOS transistor Q22 is activated for the delay time te. While the NMOS transistor Q22 is activated, the capacitor C21 is discharged via the NMOS transistor Q22. Accordingly, as shown in FIG. 17, when the NMOS transistor Q22 is activated (delay time te), the pseudo I/O interface signal dDQ falls rapidly. Thus, the pseudo I/O interface signal dDQ reaches the low level of the theoretical amplitude in a short period of time. In other words, the signal transition accelerating circuit 12 decreases the transition time of the pseudo I/O interface signal dDQ from a high level to a low level.

Figure 15:
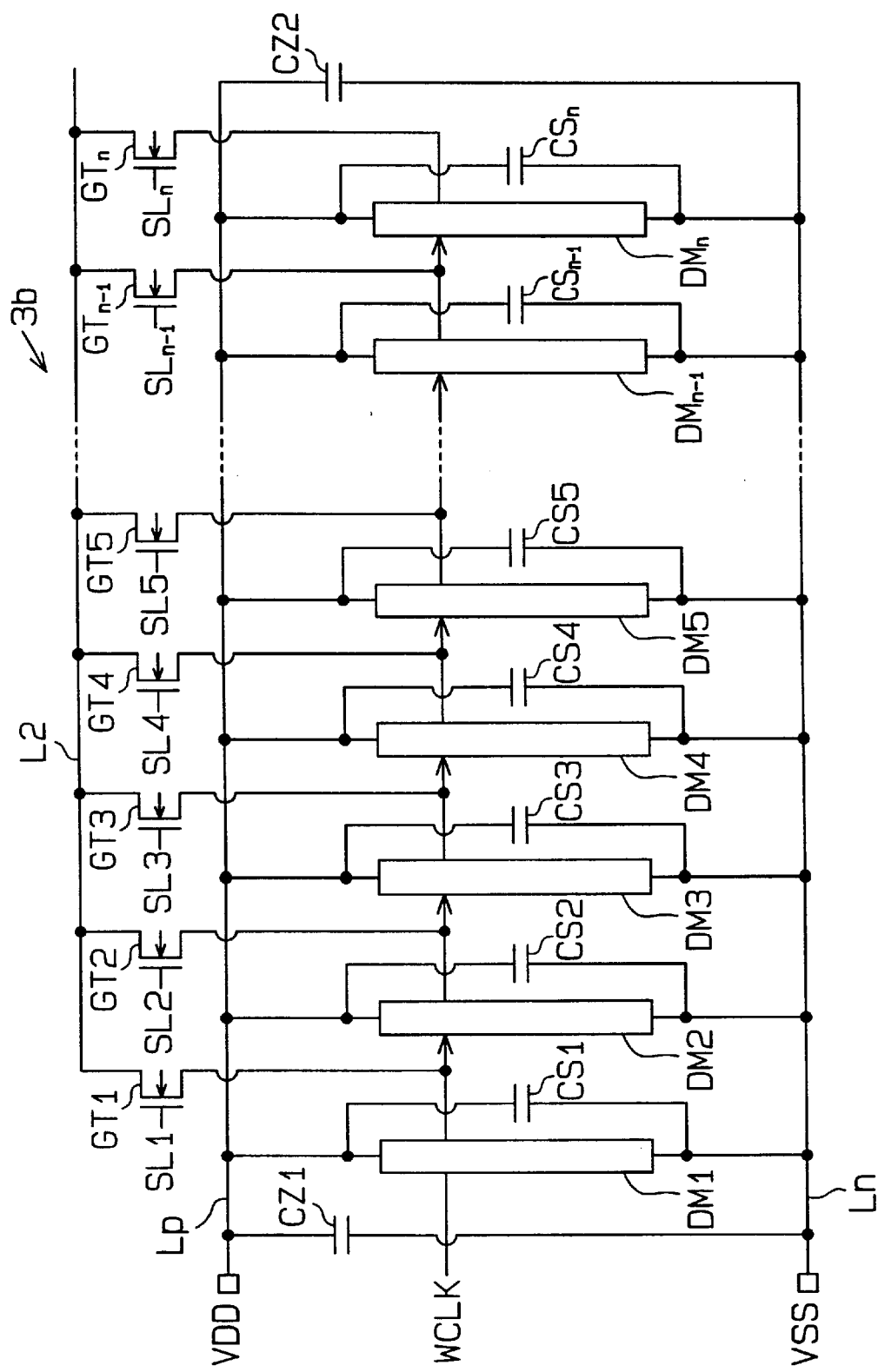
FIG. 15 is a circuit diagram showing a delay circuit section of the SDRAM of FIG. 13.
Figure 16:
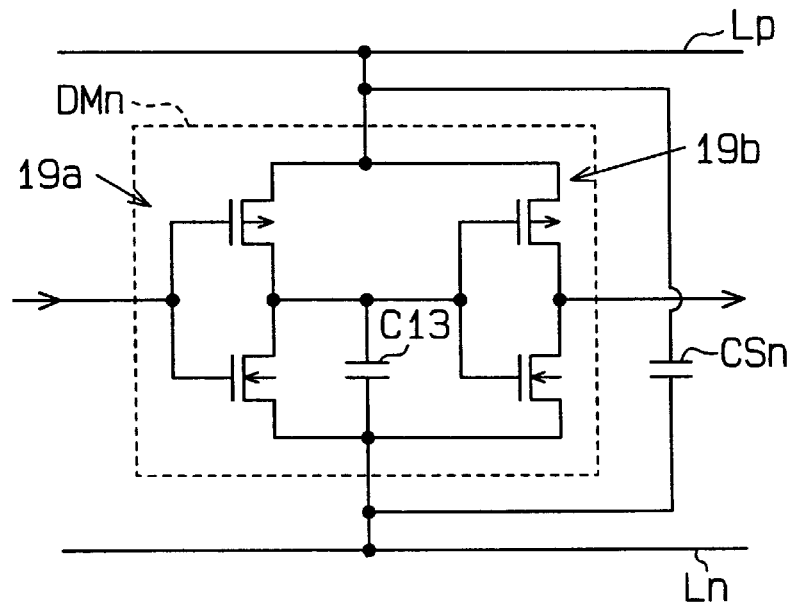
FIG. 16 is a circuit diagram showing a delay circuit of the delay circuit section of FIG. 15.

FIG. 15 is a circuit diagram showing the delay circuit section 3b, which includes delay circuits DM1–DMn connected between a pair of power supply lines Lp, Ln. As shown in FIG. 16, each of the delay circuits DM1–DMn includes two CMOS inverters 19a, 19b and a capacitor C13. The source of each PMOS transistor of the CMOS inverters 19a, 19b is connected to the power supply line Lp of the high potential power supply VDD, and the source of each NMOS transistor of the CMOS inverters 19a, 19b is connected to the power supply line Ln of the low potential power supply VSS. The capacitor C13 has a first terminal connected to a node between the output terminal of the CMOS inverter 19a and the input terminal of the CMOS inverter 19b and a second terminal connected to the poser supply line Ln. The charging and discharging time of the capacitor C13 determines the delay time of each delay circuit DM1–DMn.

Stabilizing capacitors Cs1–Csn are connected in parallel to the delay circuits DM1–DMn, respectively. When the voltage of the power supplies VDD, VSS fluctuate due to noise, the stabilizing capacitors Cs1–Csn absorb such fluctuations. Each of the stabilizing capacitors Cs1–Csn is charged by the high potential and low potential power supplies VDD, VSS via the power supply lines Lp, Ln. When the delay circuits DM1–DMn are activated in response to the external clock signal CLK, the electric charges of the stabilizing capacitors Cs1–Csn are supplied as a drive current to the associated delay circuits DM1–DMn.

The advantages of the SDRAM 1 according to the first embodiment of the present invention will now be discussed.

(1) The resistors R21, R22 set the theoretical amplitude level of the pseudo I/O interface signal dDQ which approximates the I/O interface signal DQ, and the capacitor C21 matches the load capacitance of the SSTL interface 56.

When the internal clock signal CK goes high (when the inverted internal clock signal SA goes low), the signal transition accelerating circuit 12 discharges the electric charge in the capacitor C21 in a predetermined time (delay time te). Accordingly, the trailing edge of the pseudo I/O interface signal dDQ falls rapidly during the delay time te and then falls more gradually after the delay time te has elapsed. Further, the pseudo I/O interface signal dDQ reaches the low level of the theoretical amplitude prior to the next rise time. In other words, the pseudo I/O interface signal dDQ falls to the low level of the theoretical amplitude before the next rise time even if the cycle of the internal clock signal CK is shortened. As a result, the pseudo I/O interface signal dDQ rises from the low level of the theoretical amplitude even if the internal clock signal CK becomes short.

Referring to FIG. 17, the pseudo signal input buffer 3d accurately compares the pseudo I/O interface signal dDQ with the external clock signal CLK during time periods tPD5, tPD6 from when the pseudo I/O interface signal dDQ starts to rise (when the external clock signal CLK starts to rise) to when the pseudo I/O interface signal dDQ exceeds a determination level (reference signal VREF). Accordingly, a highly accurate waveform-shaped pseudo I/O interface signal dDQ is generated even if the cycle of the internal clock signal CK (i.e., the external clock signal CLK) is shortened. The determination circuit section 3e generates a highly accurate internal clock signal CK and minimizes jitter by comparing the highly accurate pseudo I/O interface signal dDQ with the external clock signal CLK.

(2) The resistors R21, R22 in the interface portion 104 of the pseudo interface circuit section 3c have relatively high resistance values. This reduces the through current flowing through the resistors R21, R22 and thus decreases the consumed current.

(3) The NMOS transistor Q22 in the output portion 102 of the pseudo interface circuit section 3c has a relatively high drive capability. This enables the falling edge of the pseudo I/O interface signal dDQ to drop sharply. Accordingly, a highly accurate pseudo I/O interface signal dDQ is generated even if the cycle of the internal clock signal CK (i.e., the external clock signal CLK) is shortened.

(4) The stabilizing capacitors Cs1–Csn are connected in parallel to the delay circuits DM1–DMn, respectively. The stabilizing capacitors Cs1–Csn are charged by the high potential and low potential power supplies VDD, VSS and drive the associated delay circuits DM1–DMn with the charged voltage. Accordingly, the drive power supply of each delay circuit DM1–DMn is equalized and fluctuations in the drive power supply are minimized. Further, changes in the delay time of each delay circuit DM are decreased, and sudden changes in the high potential and low potential power supplies VDD, VSS caused by noise are absorbed by the stabilizing capacitors Cs1–Csn. This minimizes fluctuations in the drive power supply and decreases changes in the delay time of each delay circuit DM. As a result, a highly accurate internal clock signal CK is generated and jitter of the internal clock signal CK is minimized.

Figure 6:
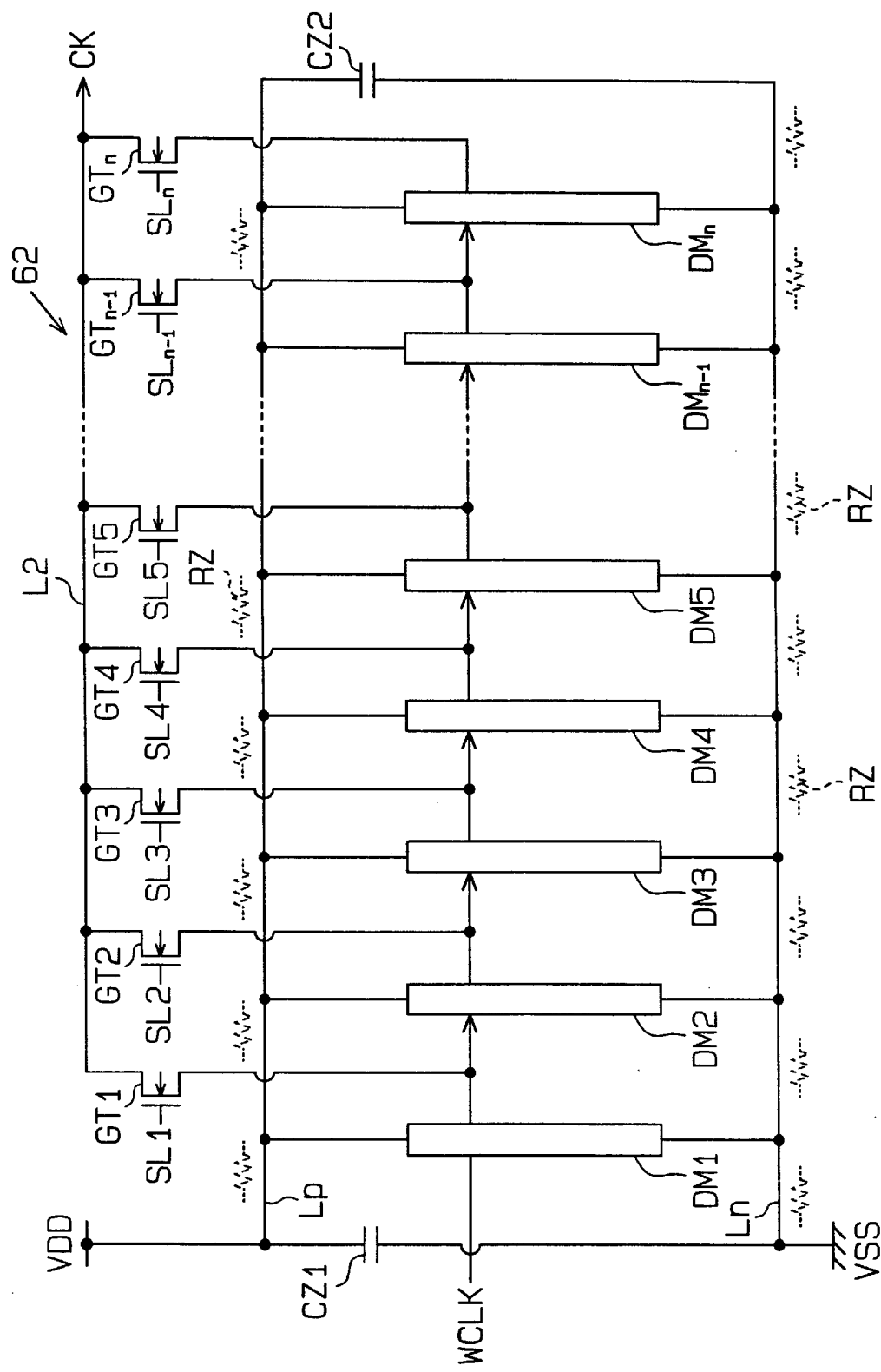
FIG. 6 is a circuit diagram showing a first delay circuit of the SDRAM of FIG. 1.

In the conventional delay circuit section 62 of FIG. 6, capacitors CZ1, CZ2 are connected to the ends of the power supply lines Lp, Ln. However, this structure provides different voltages to the delay circuits DM1–DMn. In other words, the resistance Rx of the power supply lines Lp, Ln decreases the voltage at the delay circuits DM1–DMn that are farther from the high potential and low potential power supplies VDD, VSS.

Figure 11:
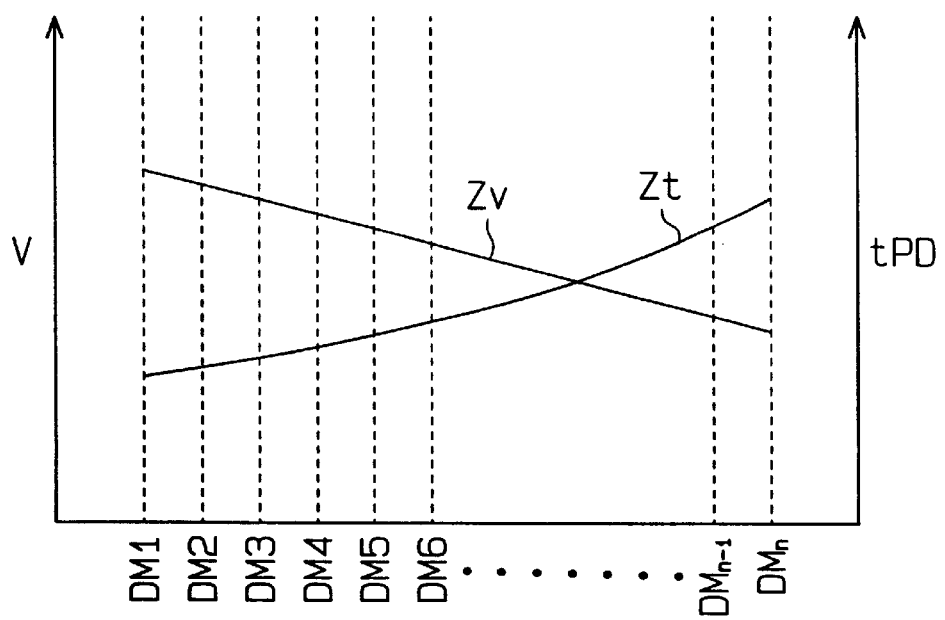
FIG. 11 is a graph showing the relationship between each delay circuit of the delay circuit section of FIG. 6, the supplied voltage, and the delay time.

FIG. 11 shows the relationship between the delay circuits DM1–DMn of the conventional delay circuit section 62 and the supplied voltage V with a characteristic line Zv, and the relationship between the delay circuits DM1–DMn and the delay time tPD with a characteristic line Zt. As apparent from FIG. 11, the supplied voltage V decreases and the delay time tPD increases at locations farther from the high potential and low potential power supplies VDD, VSS.

Figure 18:
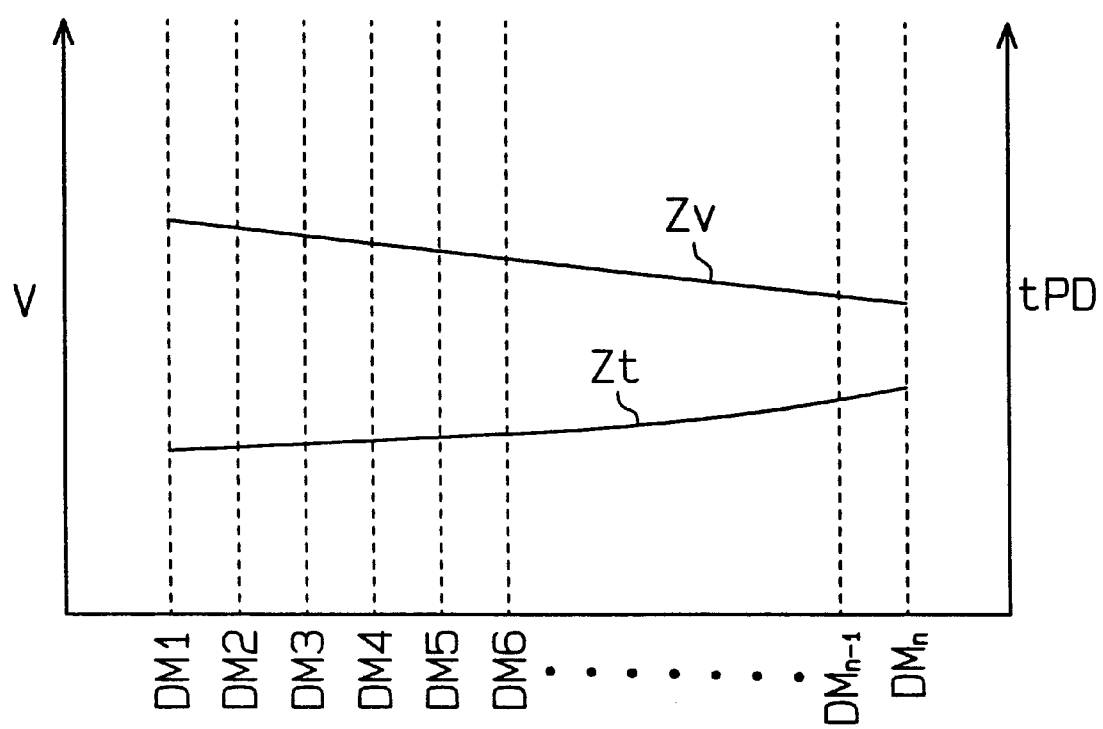
FIG. 18 is a graph showing the relationship between each delay circuit of the delay circuit section of FIG. 15, the supplied voltage, and the delay time.

FIG. 18 shows the relationship between the delay circuits DM1–DMn of the delay circuit section 3b according to the first embodiment with a characteristic line Zv, and the relationship between the delay circuits DM1–DMn and the delay time tPD with a characteristic line Zt. As apparent from FIG. 18, the change in the voltage V supplied to the delay circuits DM1–DMn is small. Accordingly, the change in the delay time tPD of the delay circuits DM1–DMn is small.

[Second Embodiment]

Figure 19:
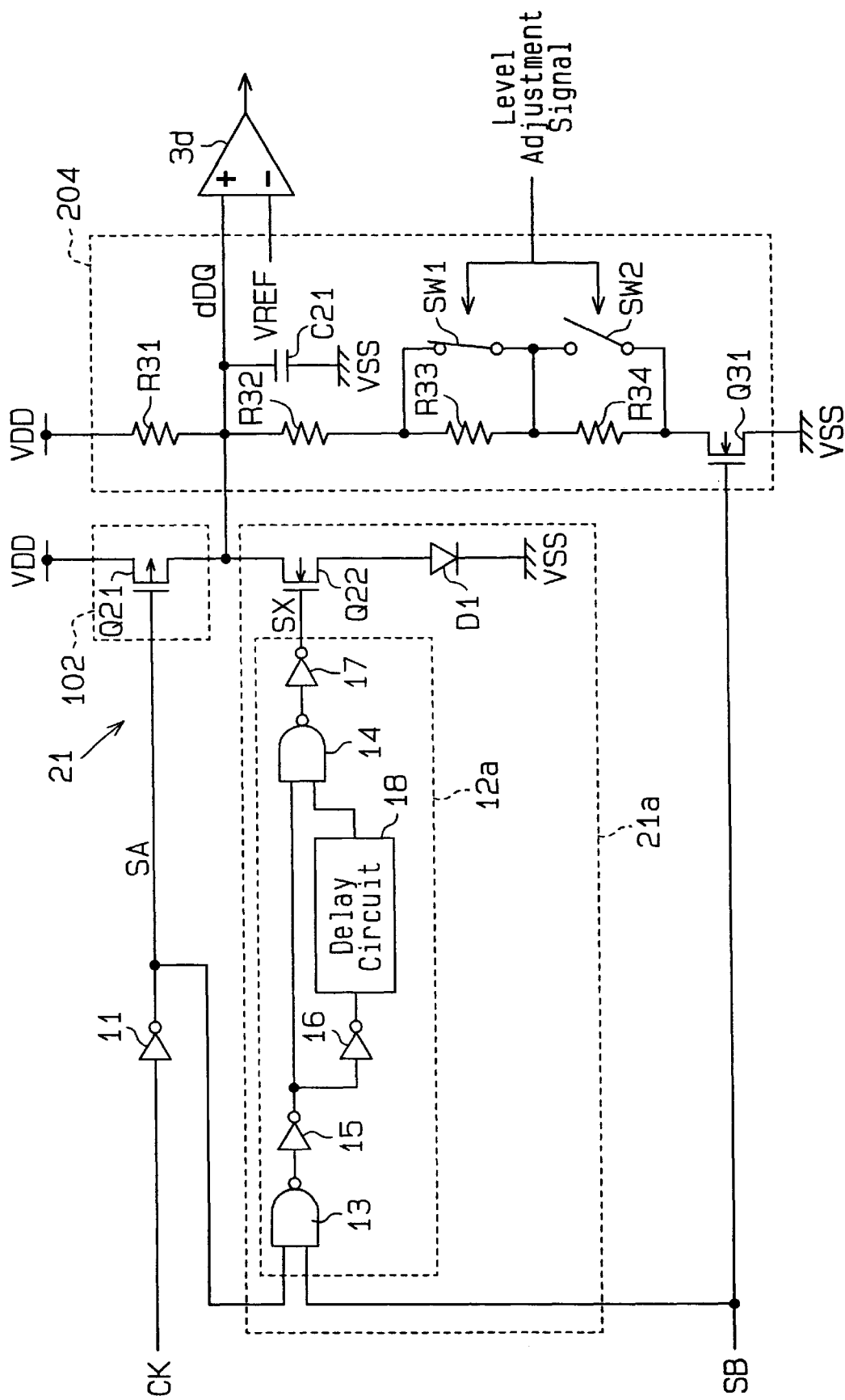
FIG. 19 is a circuit diagram showing a pseudo interface circuit section according to a second embodiment of the present invention.

FIG. 19 is a circuit diagram showing a pseudo interface circuit section 21 according to a second embodiment of the present invention. The pseudo interface circuit section 21 has an interface portion 204 including four resistors R31, R32, R33, R34, an NMOS transistor Q31, and switches SW1, SW2. The resistor R31 has a first terminal connected to the drain of the PMOS transistor Q21 and a second terminal connected to the high potential power supply VDD. The resistor R32 has a first terminal connected to the drain of the PMOS transistor Q21 and a second terminal connected to the drain of the NMOS transistor Q31 via the resistors R33, R34. The source of the NMOS transistor Q31 is connected to the low potential power supply VSS. The gate of the NMOS transistor Q31 receives the standby signal SB. The resistors R33, R34 are connected parallel to switches SW1, SW2, respectively. MOS transistors or fuses may be used as the switches SW1, SW2. The switches SW1, SW2 are activated and deactivated in accordance with a level adjustment control signal from a control circuit (not shown) of the SDRAM 1. The switches SW1, SW2 are selectively activated and deactivated to adjust the theoretical amplitude level of the pseudo I/O interface signal dDQ.

The source of the NMOS transistor Q22 of a signal transition accelerating circuit 21a is connected to a low potential power supply VSS via a diode D1.

The advantages of the pseudo interface circuit section 21 according to the second embodiment of the present invention will now be discussed.

(1) The selective activation and deactivation of the switches SW1, SW2 allow adjustment of the theoretical amplitude level of the pseudo I/O interface signal dDQ.

(2) The NMOS transistor Q31 is activated when the standby signal SB is high and deactivated when the standby signal SB is low (when in the standby state). Accordingly, in the standby state, through current does not flow through the resistors R31, R32, R33, R34 and the NMOS transistor Q31. This further decreases power consumption.

(3) The diode D1 is connected between the source of the NMOS transistor Q22 and the low potential power supply VSS. When the NMOS transistor Q22 is activated, the voltage at the diode D1 prevents the level of the pseudo I/O interface signal dDQ from becoming lower than the low level of the theoretical amplitude due to excessive discharging of the capacitor C21.

[Third Embodiment]

Figure 20:
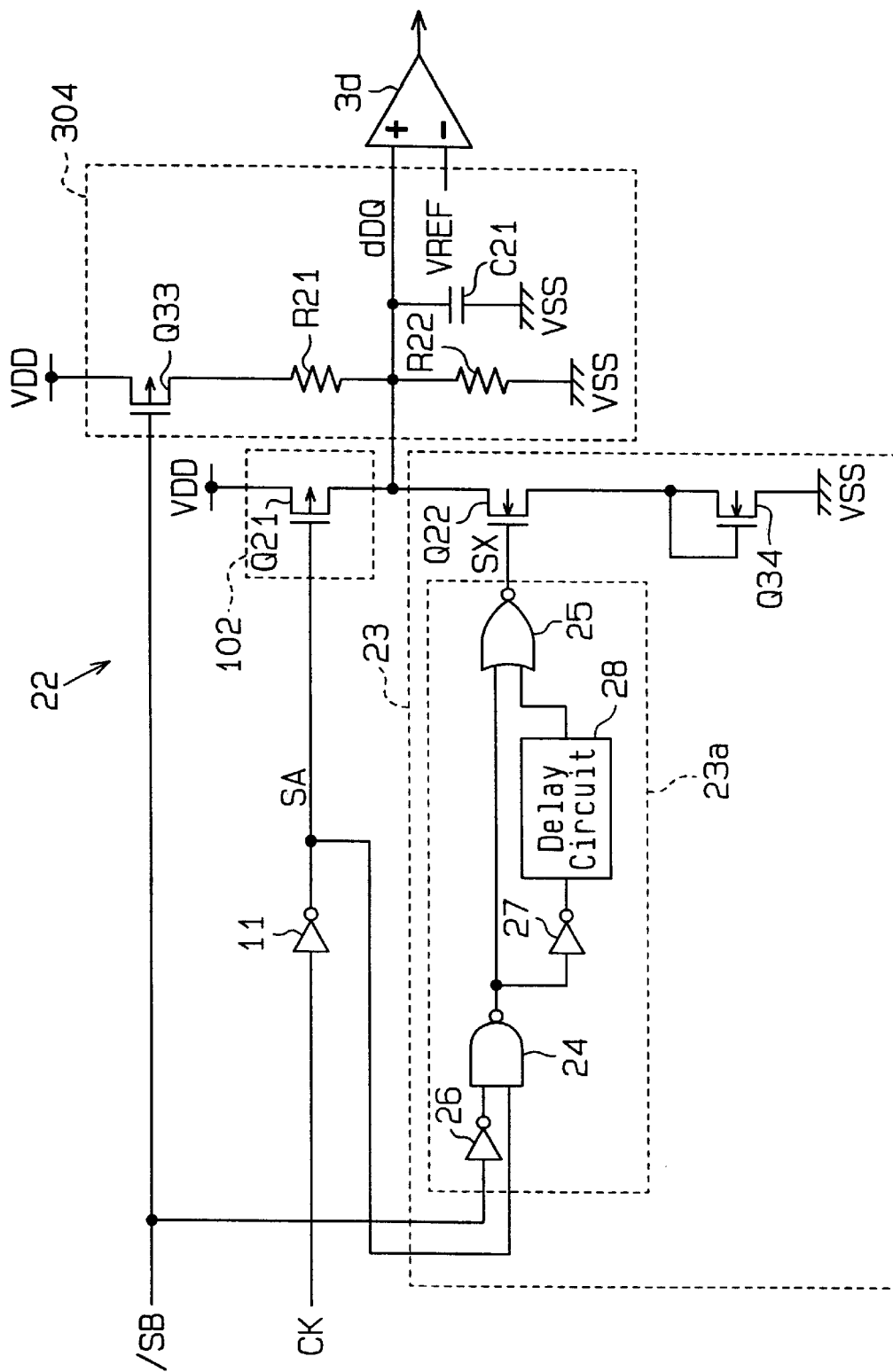
FIG. 20 is a circuit diagram showing a pseudo interface circuit section according to a third embodiment of the present invention.

FIG. 20 is a circuit diagram showing a pseudo interface circuit section 22 according to a third embodiment of the present invention. The pseudo interface circuit section 22 has an interface portion 304, which includes a PMOS transistor Q33 connected between the resistor R21 and the high potential power supply VDD. The gate of the PMOS transistor Q33 receives a standby signal /SB. The standby signal /SB goes high when in a standby state and goes low when not in a standby state. Accordingly, the PMOS transistor Q33 is deactivated when the SDRAM 1 is in a standby state.

A signal transition accelerating circuit 23 has a discharge control circuit 23a including a NAND circuit 24, a NOR circuit 25, two inverters 26, 27, and a delay circuit 28. The NAND circuit 24 receives the inverted internal clock signal SA, which is the signal generated when the inverter 11 inverts the internal clock signal CK, and the standby signal /SB, which is inverted by the inverter 26, to generate a NAND logic signal. Accordingly, when in a non-standby state, the NAND logic circuit goes low every time the inverted internal clock signal SA goes high (the internal clock signal CK goes low).

The NAND logic signal is provided to the NOR circuit 25 and to the delay circuit 28 via the inverter 27. The delay circuit 28 includes an even number of inverters that delay the NAND logic signal, which is inverted by the inverter 27, by a delay time "te" and sends a delayed NAND logic signal to the NOR circuit 25. Accordingly, when the NAND logic signal is low, the NOR circuit 25 causes the NOR logic signal to go high for a period corresponding to the delay time te. The NOR logic signal is sent to the gate of the NMOS transistor Q22 as the control signal SX. When the PMOS transistor Q21 is deactivated, the NMOS transistor Q22 is activated for a period corresponding to the delay time te.

An NMOS transistor Q34 is connected between the source of the NMOS transistor Q22 and the low potential power supply VSS. The gate of the NMOS transistor Q34 is connected to its drain. The NMOS transistor Q34 functions as an ON resistor together with the NMOS transistor Q22.

The advantages of the pseudo interface circuit section 22 according to the third embodiment of the present invention will now be discussed.

(1) The PMOS transistor Q33 is activated when the standby signal /SB is low and deactivated when the standby signal SB is high (in the standby state). Accordingly, current does not flow through the resistors R21, R22 and the PMOS transistor Q33 in the standby state. This decreases power consumption.

(2) When the NMOS transistor Q22 is activated, the ON resistance of the NMOS transistor Q34 prevents excessive discharging of the capacitor C21 from causing the level of the pseudo I/O interface signal dDQ to be lower than the low level of the theoretical amplitude.

[Fourth Embodiment]

Figure 21:
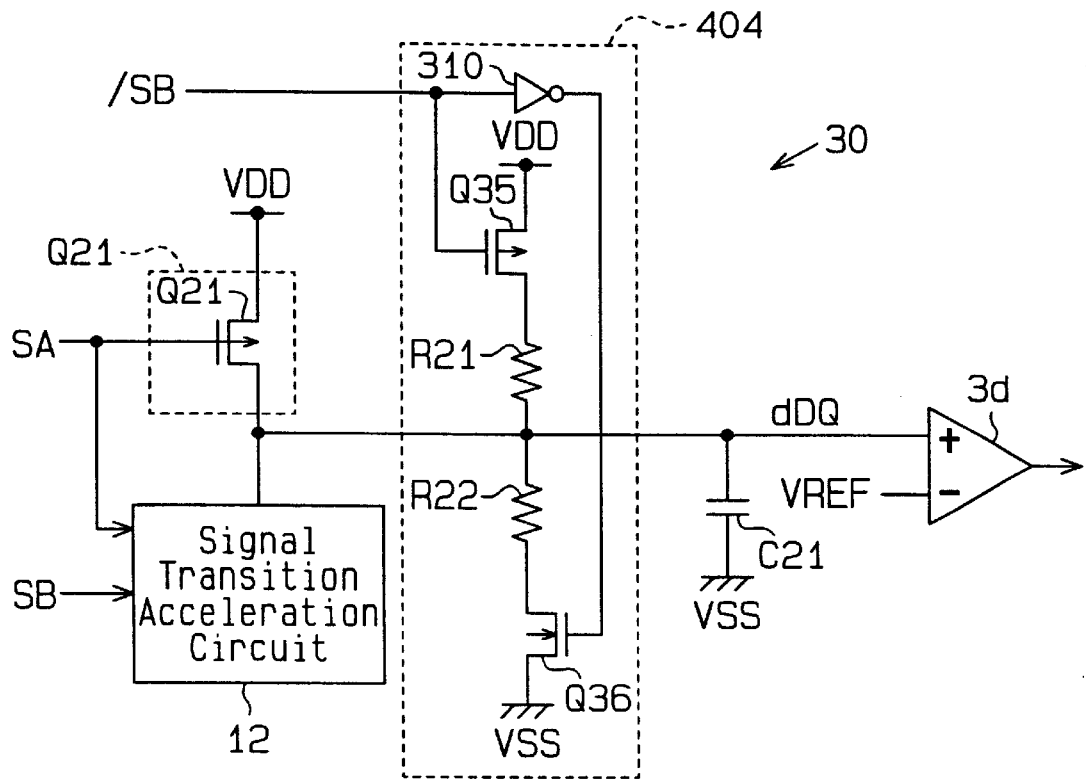
FIG. 21 is a circuit diagram showing a pseudo interface circuit section according to a fourth embodiment of the present invention.

FIG. 21 is a circuit diagram showing a pseudo interface circuit section 30 according to a fourth embodiment of the present invention. The pseudo interface circuit section 30 has an interface portion 404, which includes a PMOS transistor Q35 connected between the resistor R21 and the high potential power supply VDD, an NMOS transistor Q36 connected between the resistor R22 and the low potential power supply VSS, and an inverter 310 connected between the gate of the PMOS transistor Q35 and the gate of the NMOS transistor Q36. The gate of the PMOS transistor Q35 receives the standby signal /SB, and the gate of the NMOS transistor Q36 receives the standby signal /SB inverted by the inverter 310. Accordingly, the PMOS transistor Q35 and the NMOS transistor Q36 are deactivated when the SDRAM 1 is in a standby state. Thus, current does not flow through the resistors R21, R22, the PMOS transistor Q35, and the NMOS transistor Q36 during standby. This decreases power consumption. In the fourth embodiment, the standby signal may be substituted by a control signal, which is activated for a period of time that is longer than the standby state.

[Fifth Embodiment]

Figure 22:
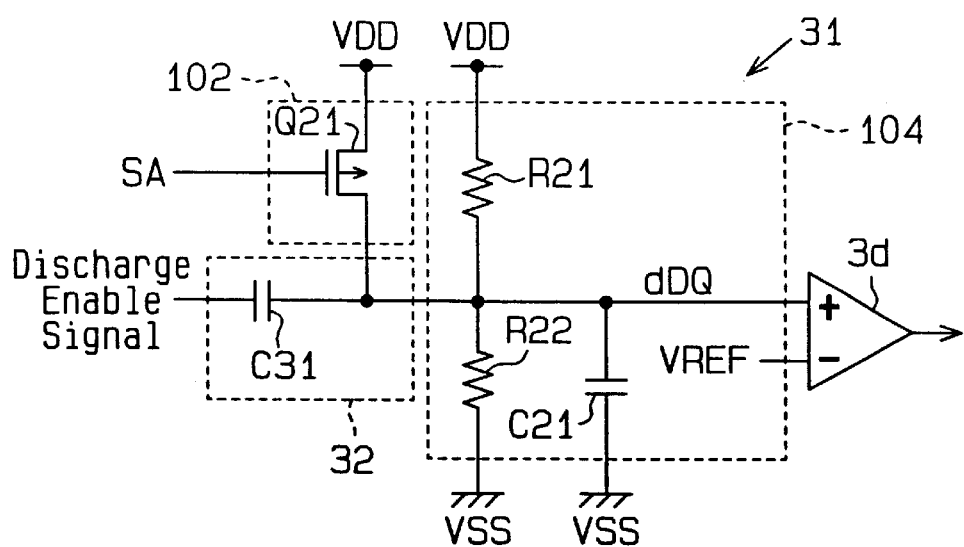
FIG. 22 is a circuit diagram showing a pseudo interface circuit section according to a fifth embodiment of the present invention.

FIG. 22 is a circuit diagram showing a pseudo interface circuit section 31 according to a fifth embodiment of the present invention. The pseudo interface circuit section 31 has the interface portion 104 (FIG. 14) and a signal transition accelerating circuit 32, which is formed by a capacitor C31. The capacitor C31 has a first terminal connected to the drain of the PMOS transistor Q21 and a second terminal which receives a discharge enable signal. When the inverted internal clock signal SA goes high, a low discharge enable signal is provided to the capacitor C31 during a predetermined time period corresponding to the delay time te, and the electric charge accumulated in the capacitor C21 is distributed by the capacitor C31. Accordingly, the trailing edge of the pseudo I/O interface signal dDQ becomes steep. Thus, the signal transition accelerating circuit 32 is easily formed by the capacitor C31.

[Sixth Embodiment]

Figure 23:
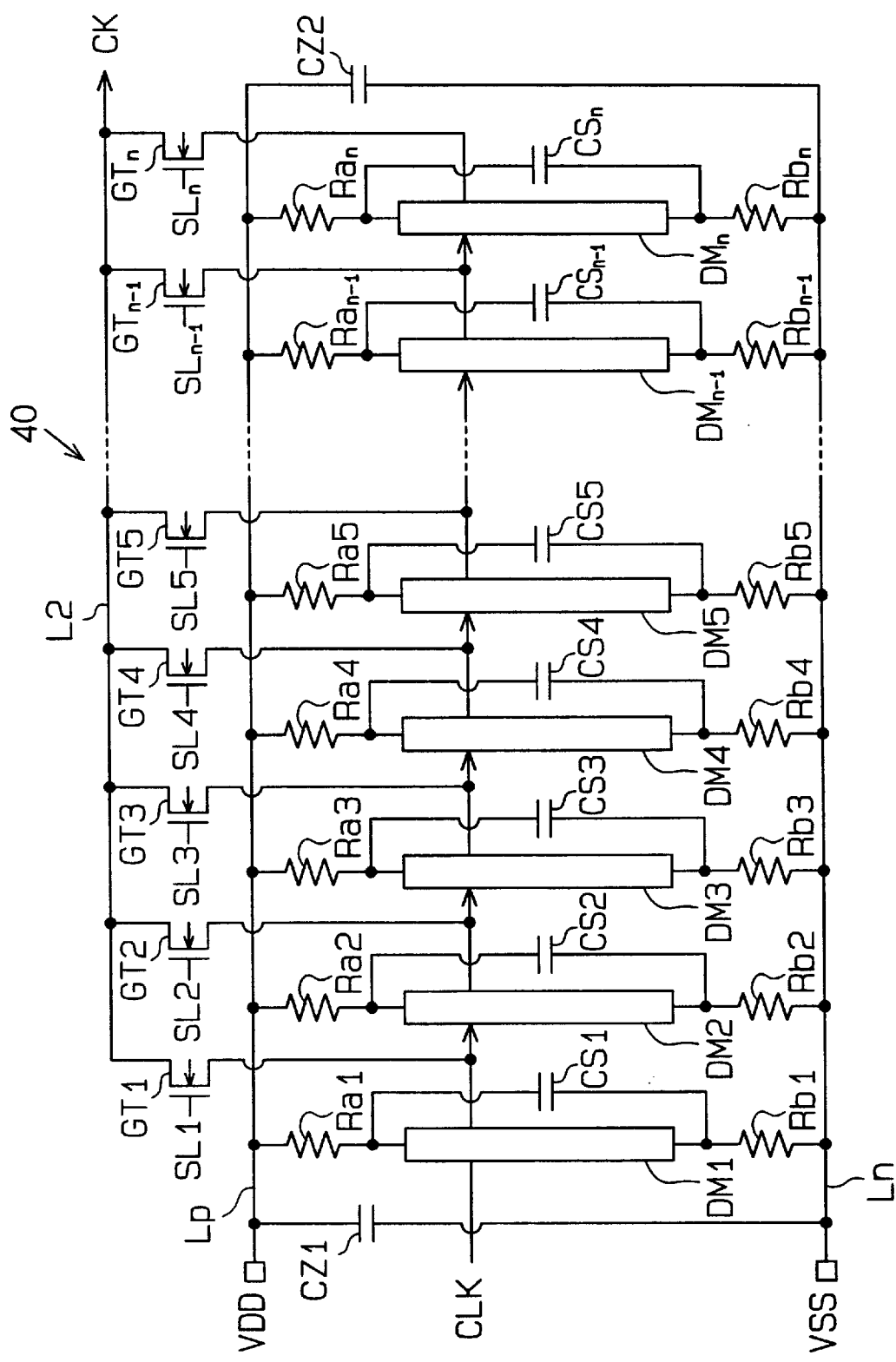
FIG. 23 is a circuit diagram showing a delay circuit section according to a sixth embodiment of the present invention.

FIG. 23 is a circuit diagram showing a delay circuit section 40 according to a sixth embodiment of the present invention. The delay circuit section 40 includes resistors Ra1–Ran connected between respective delay circuits DM1–DMn and the power supply line Lp and resistors Rb1–Rbn connected between the respective delay circuits DM1–DMn and the power supply line Ln. The resistors Ra1–Ran, Rb1–Rbn and the associated stabilizing capacitors Cs1–Csn form low pass filters. In other words, each of the delay circuits DM1–DMn has a low pass filter.

Accordingly, fluctuations in the voltage of the power supply provided to the delay circuits DM1–DMn are further minimized and changes in the delay time of the delay circuits DM1–DMn are reduced even if noise suddenly causes the high potential and low potential power supplies VDD, VSS to fluctuate. As a result, a highly accurate internal clock signal CK is generated and jitter of the internal clock signal CK is decreased.

Figure 24:
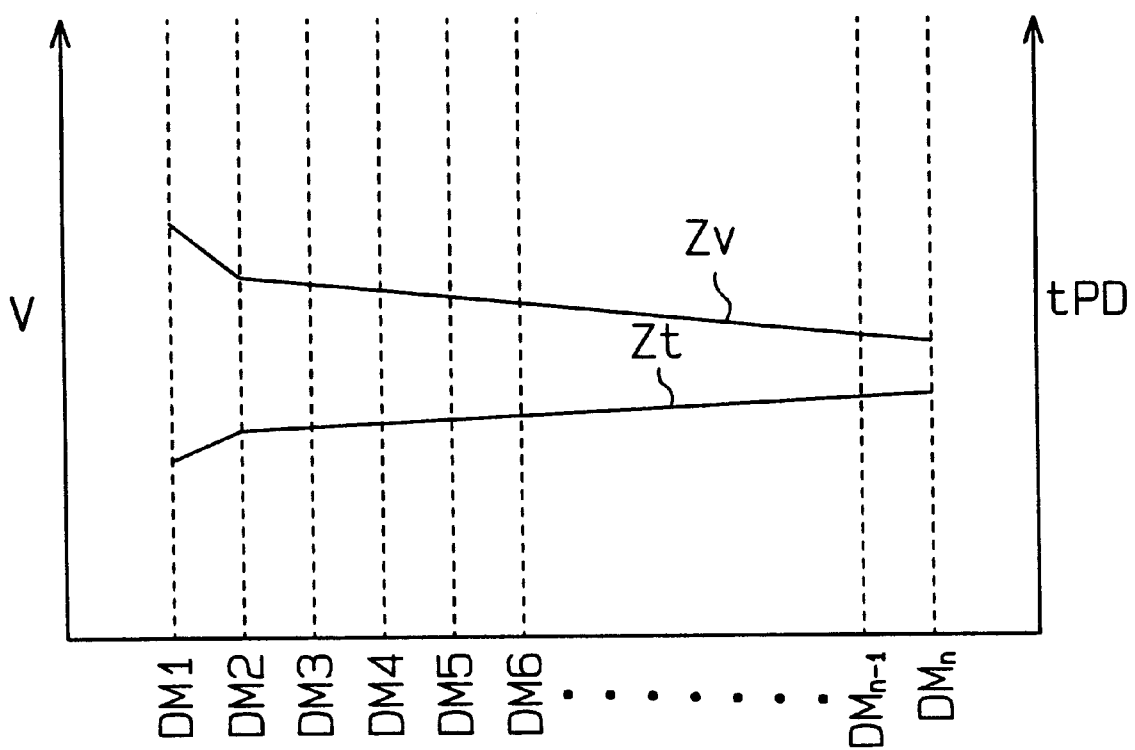
FIG. 24 is a graph showing the relationship between each delay circuit of the delay circuit section of FIG. 23, the supplied voltage, and the delay time.

FIG. 24 shows the relationship between the delay circuits DM1–DMn of the delay circuit section 40 and the supplied voltage with a characteristic line Zv, and the relationship between the delay circuits DM1–DMn and the delay time tPD with a characteristic line Zt. As apparent from FIG. 24, the changes in the supplied voltage V and the delay time tPD are small. This is because the low pass filters of the delay circuits DM1–DMn absorb voltage fluctuations of the delay circuits DM1–DMn.

Figure 7:
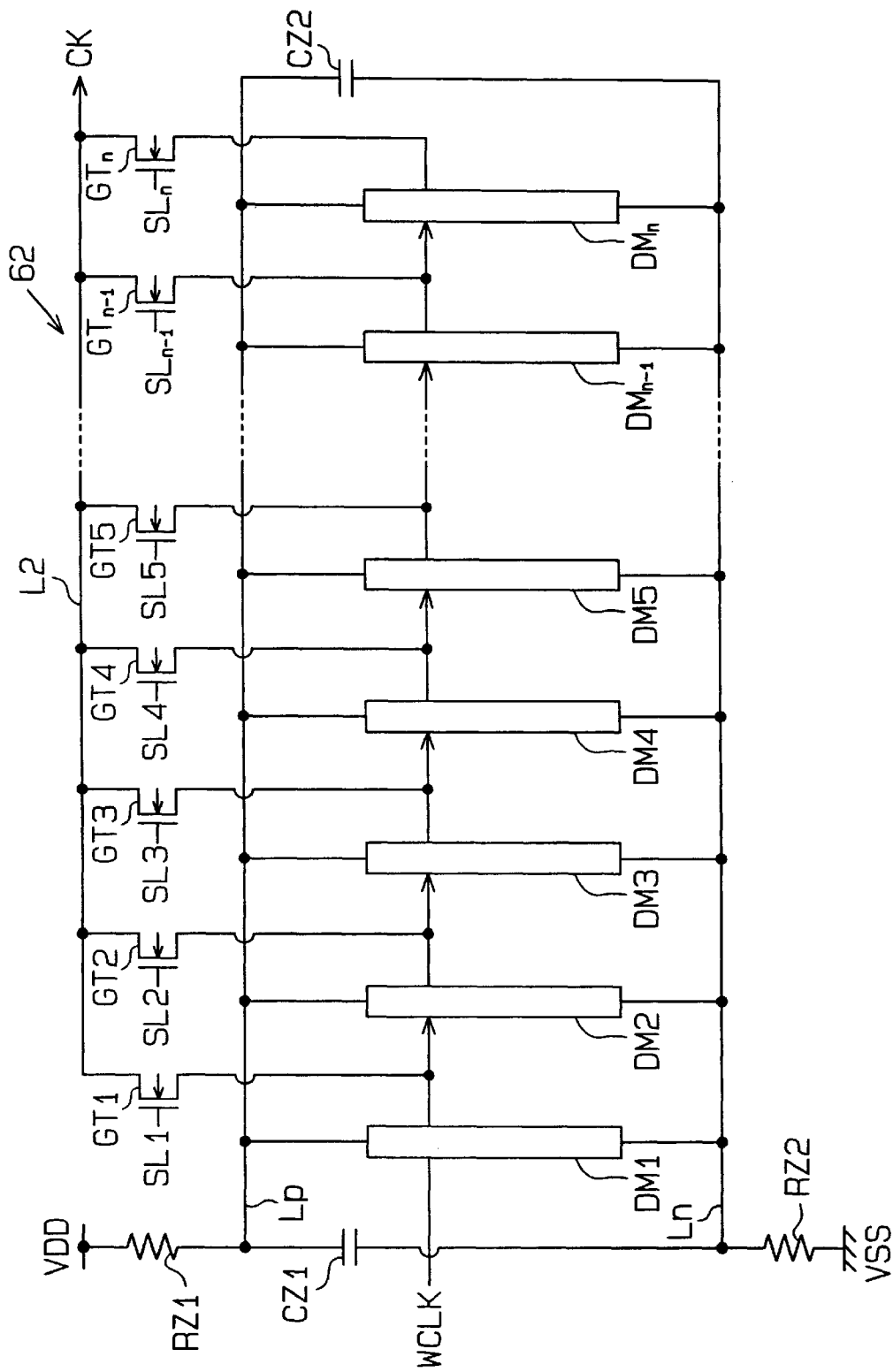
FIG. 7 is a circuit diagram showing a second delay circuit of the SDRAM of FIG. 1.
Figure 8:
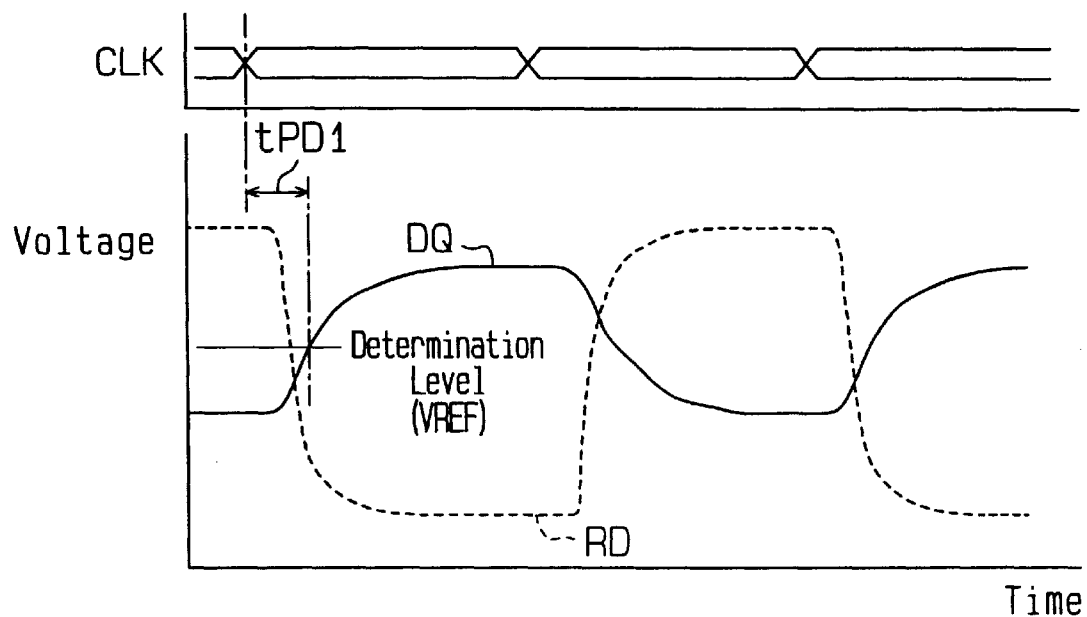
FIG. 8 is a chart showing the waveform of an external I/O interface signal generated by the SSTL interface of FIG. 2.
Figure 9:
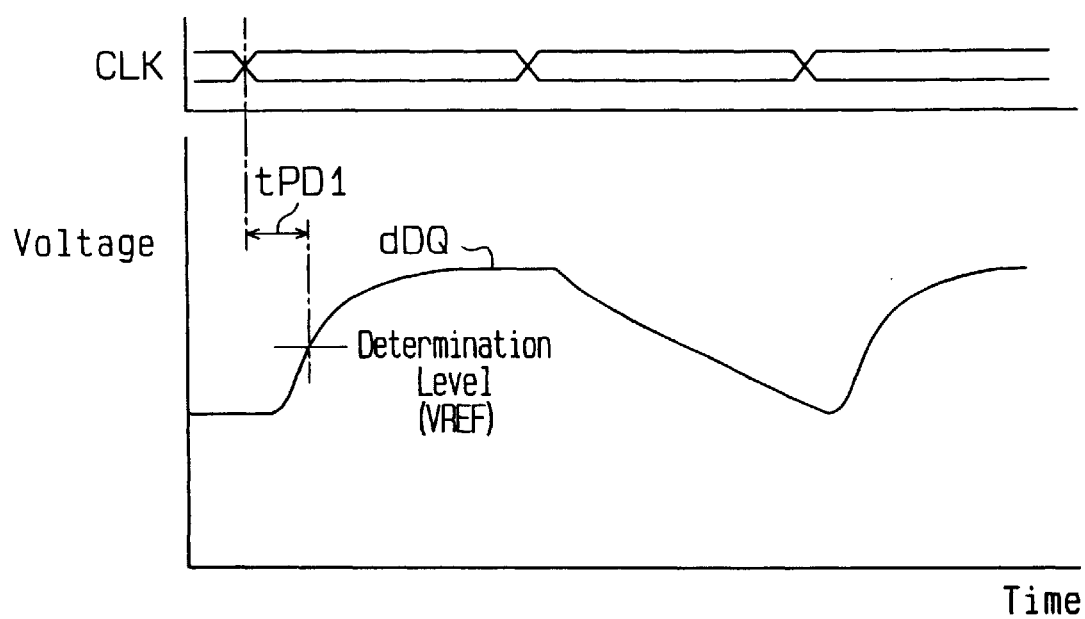
FIG. 9 is a chart showing the waveform of a pseudo I/O interface signal generated by the pseudo interface circuit section of FIG. 4.
Figure 10:
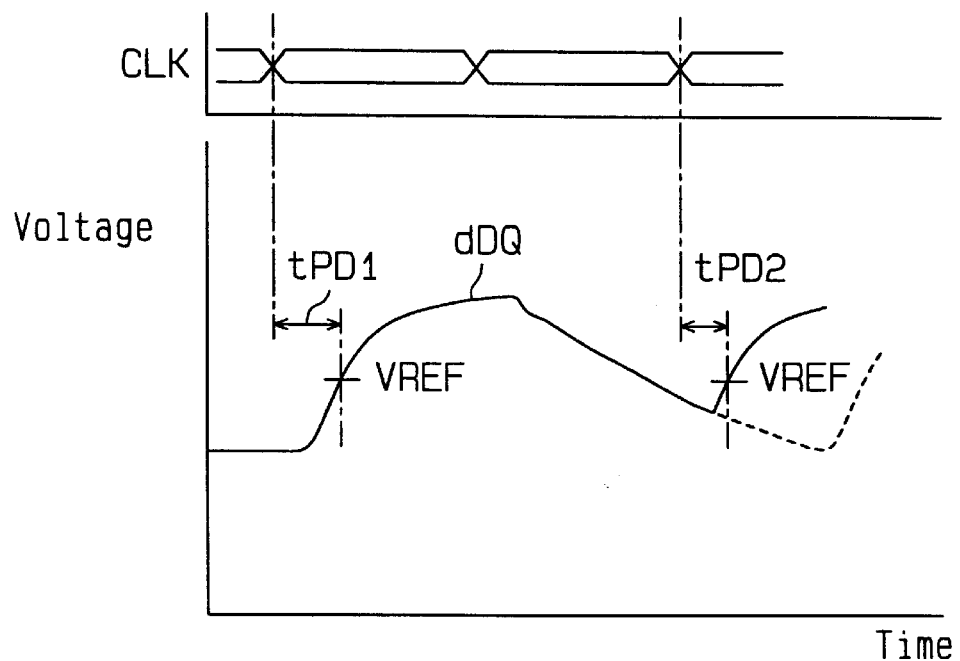
FIG. 10 is a chart showing the waveform of the pseudo I/O interface signal generated by the pseudo interface circuit section of FIG. 4.
Figure 12:
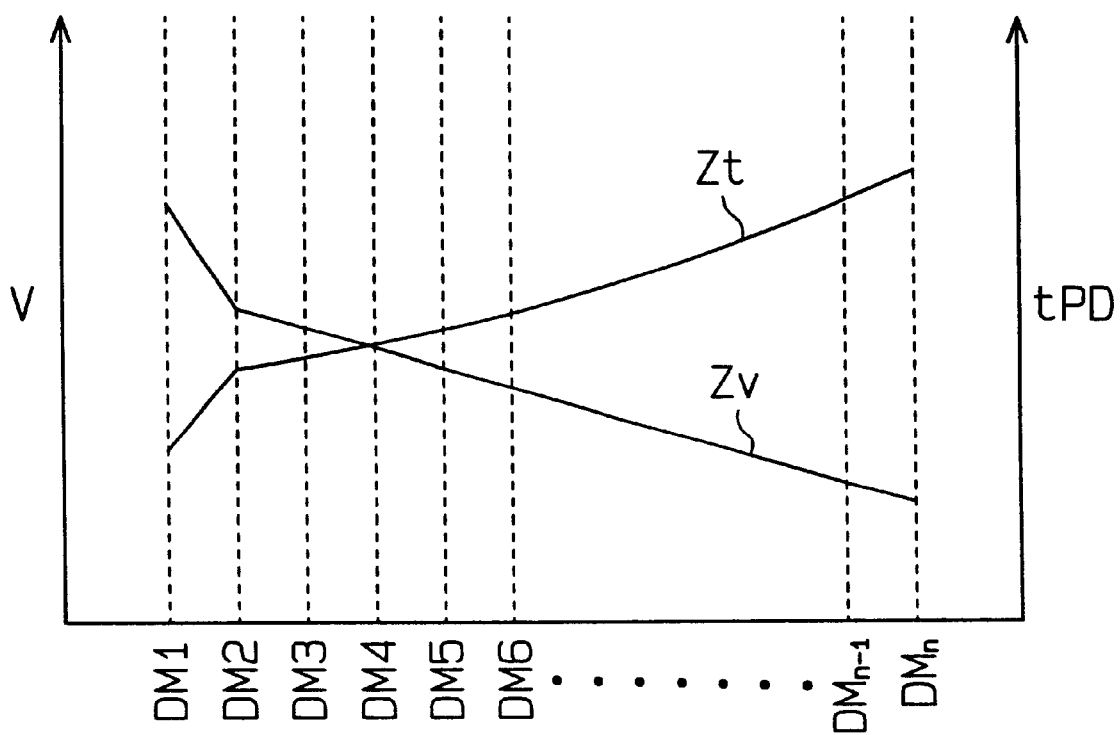
FIG. 12 is a graph showing the relationship between each delay circuit of the delay circuit section of FIG. 7, the supplied voltage, and the delay time.

FIG. 7 is a circuit diagram showing the conventional delay circuit section 62 provided with a low pass filter. The delay circuit section 62 includes a resistor RZ1 connected between the power supply line Lp and the high potential power supply VDD, a resistor RZ2 connected between the power supply line Ln and the low potential power supply VSS, and capacitors CZ1, CZ2 connected to the ends of the power supply lines Lp, Ln. The resistors RZ1, RZ2 and the capacitors CZ1, CZ2 form a low pass filter. FIG. 12 shows the characteristic lines Zv and Zt of the delay circuit section 62 of FIG. 7. As apparent from FIG. 12, the supplied voltage V decreases and the delay time tPD increases at locations farther from the high potential and low potential power supplies VDD, VSS. It is believed that this is because the voltage fluctuation is absorbed by the single low pass filter for all of the delay circuits DM1–DMn. In other words, the absorption of voltage fluctuation is not effective when only one low pass filter is used.

[Seventh Embodiment]

Figure 25:
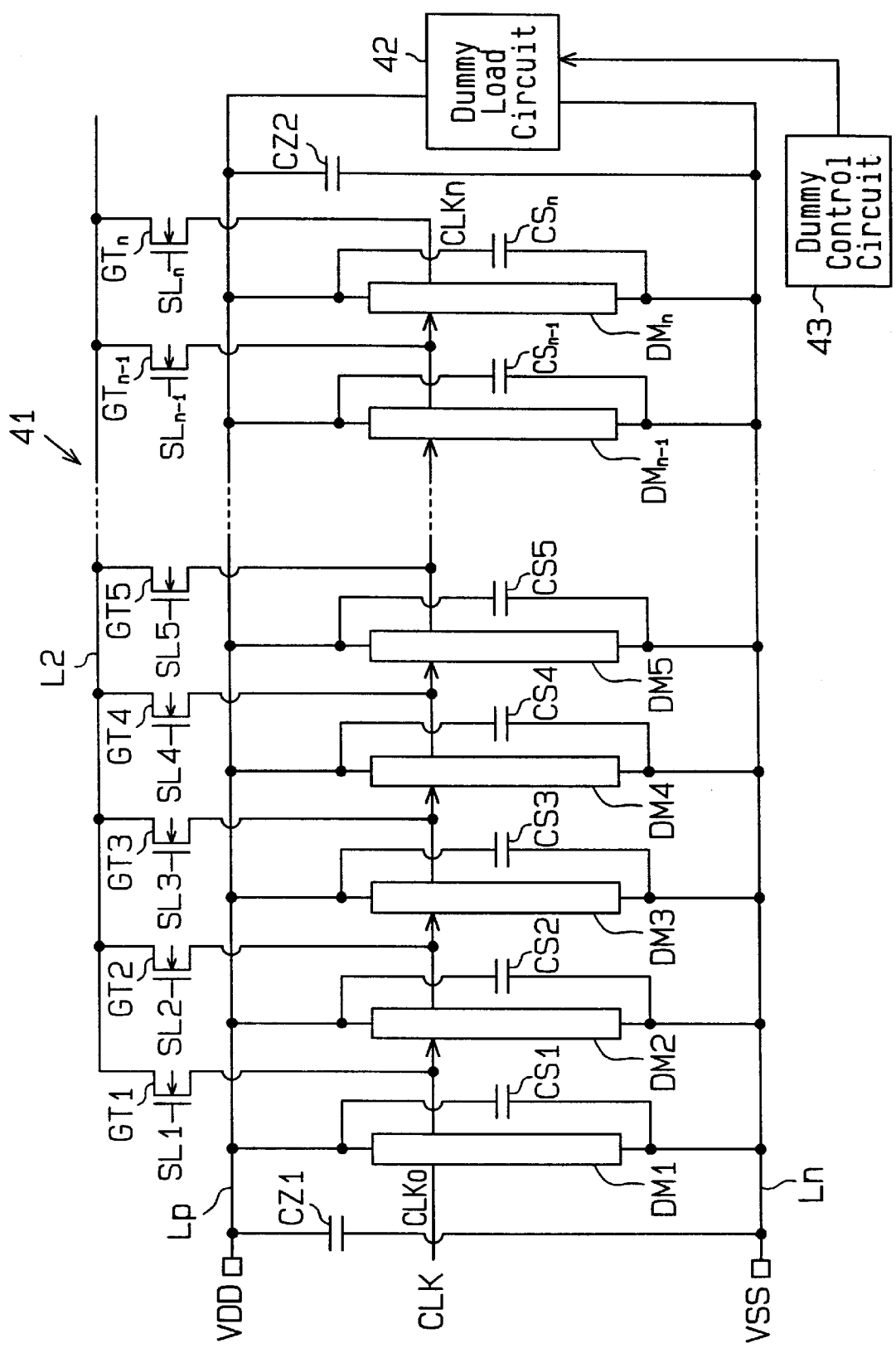
FIG. 25 is a circuit diagram showing a delay circuit section according to a seventh embodiment of the present invention.
Figure 26:
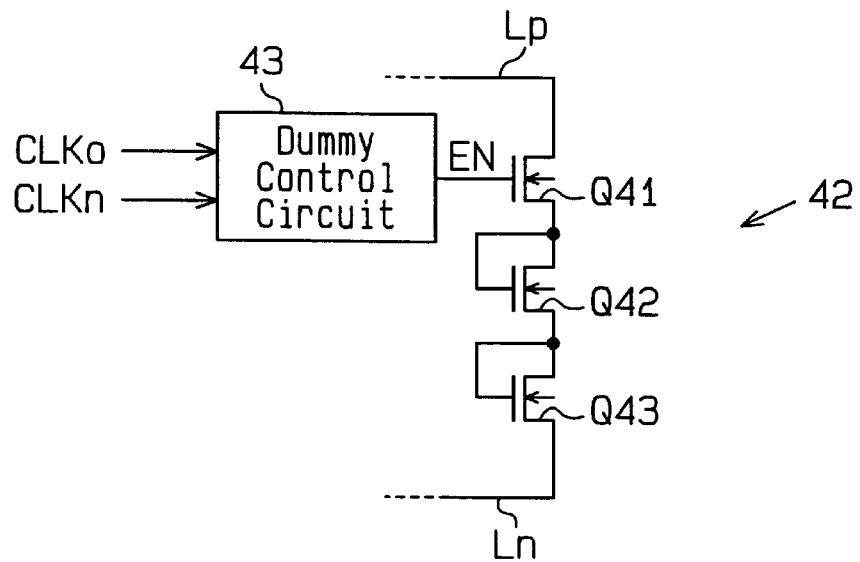
FIG. 26 is a circuit diagram showing a dummy load circuit of the delay circuit section of FIG. 25.

FIG. 25 is a circuit diagram showing a delay circuit section 41 according to a seventh embodiment of the present invention. The delay circuit section 41 has a dummy load circuit 42 connected between the power supply lines Lp, Ln. As shown in FIG. 26, the dummy load circuit 42 includes a drive NMOS transistor Q41 and two ON resistor transistors Q42, Q43. The drain of the drive NMOS transistor Q41 is connected to the power supply line Lp, and the source of the drive NMOS transistor Q41 is connected to the power supply line Ln via the ON resistor NMOS transistors Q42, Q43. The ON resistor NMOS transistors Q42, Q43 are activated when the drive NMOS transistor Q41 is activated, and the ON resistance of the NMOS transistors Q42, Q43 form a constant current circuit. It is preferred that the total ON resistance of the NMOS transistors Q42, Q43 be greater than the line resistance value (parasitic resistance value) of the power supply lines Lp, Ln.

The gate of the drive NMOS transistor Q41 receives an enable signal EN from a dummy control circuit 43. The dummy control circuit 43 receives the external clock signal CLK (CLK0 in FIG. 26) which is provided to the first delay circuit DM1 and the external clock signal (CLKn in FIG. 26) output by the final delay circuit DMn. The dummy control circuit 43 determines the active time T1 and the inactive time T2 of the delay circuit section 41 based on the clock signals CLK0, CLKn. During the inactive time T2 of the delay circuit section 41, the dummy control circuit 43 causes the enable signal EN to go high in order to activate the drive NMOS transistor Q41.

The active time T1 of the delay circuit section 41 is the period from when the first delay circuit DM1 receives a high (or low) inverted external clock signal CLK0 to when the final delay circuit DMn outputs a high (or low) inverted external clock signal CLKn. The inactive time T2 of the delay circuit section 41 is the period from when the final delay circuit DMn outputs a high (or low) inverted external clock signal CLKn to when the first delay circuit DM1 receives a high (or low) inverted external clock signal CLK0.

Figure 27:
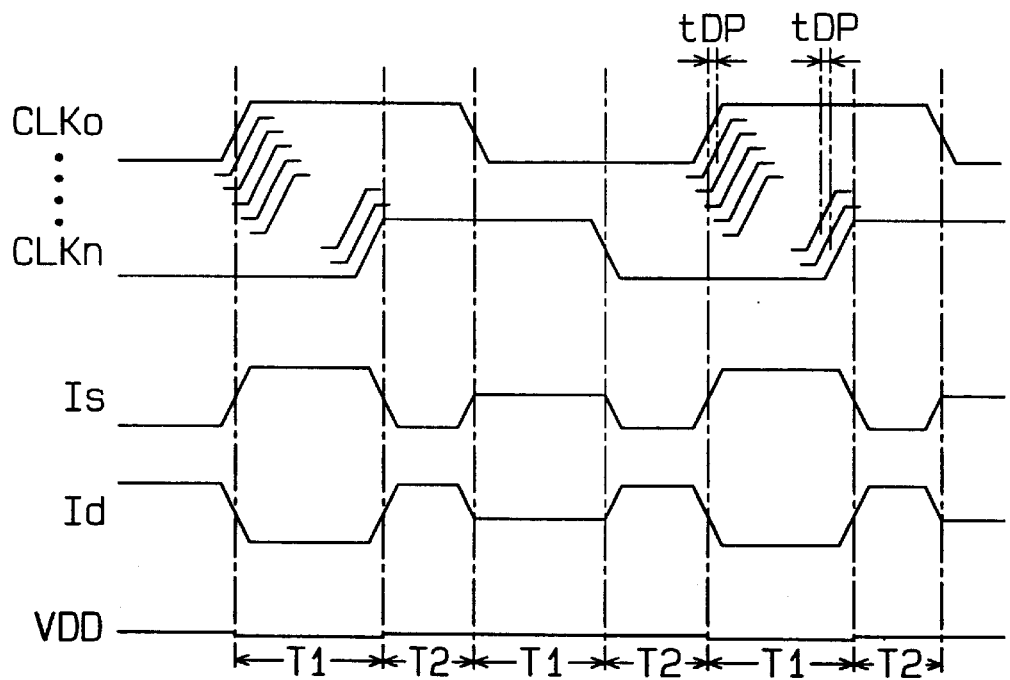
FIG. 27 is a chart showing waveforms during operation of the delay circuit section of FIG. 25.

Accordingly, during the inactive time T2, the drive NMOS transistor Q41 is activated and a dummy load current Id flows through the dummy load circuit 42 based on the high potential and low potential power supplies VDD, VSS. During the active time T1, the drive NMOS transistor Q41 is deactivated thereby impeding the flow of the dummy load current Id through the dummy load circuit 42. Therefore, the drive current Is (FIG. 27), which is consumed by the delay circuits DM1–DMn, flows to the power supply lines Lp–Ln during the active time T1, and the dummy load current Id, which is consumed by the dummy load circuit 42, flows to the power supply lines Lp–Ln during the inactive time T2. Consequently, a constant current always flows through the power supply lines Lp, Ln. This maintains the high potential power supply VDD voltage of the delay circuit section 41 at a substantially constant value, as shown in FIG. 27.

Figure 28:
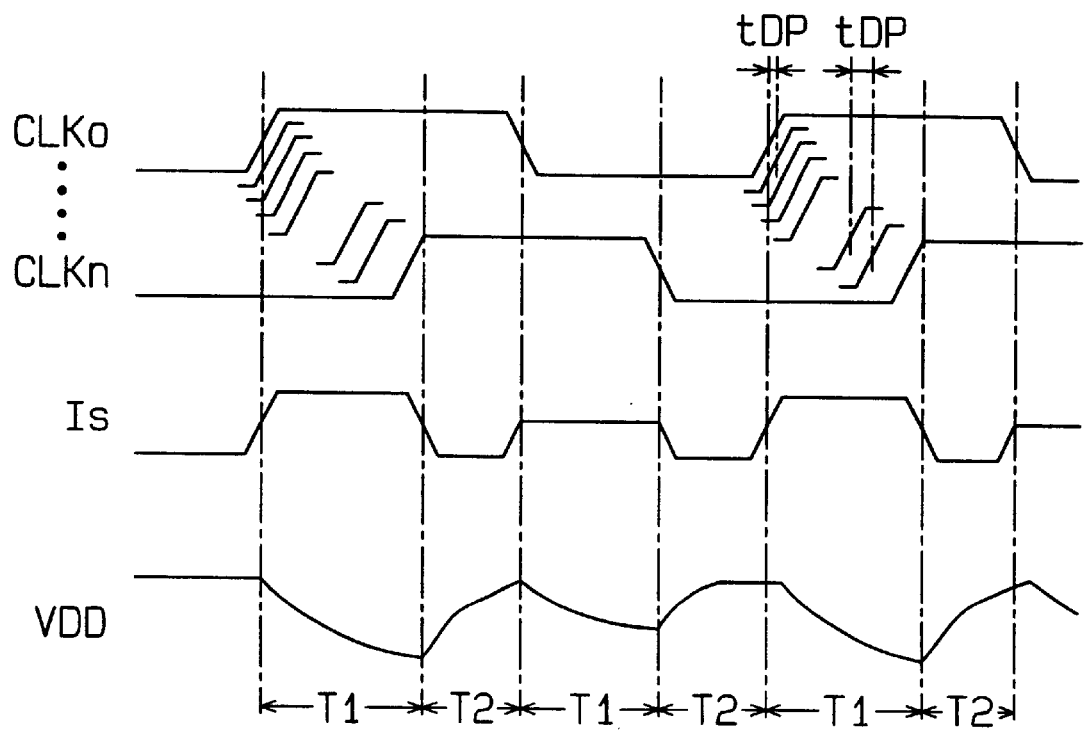
FIG. 28 is a chart showing waveforms of a delay circuit section that does not have the dummy load section of FIG. 26.

FIG. 28 is a chart showing the waveform of a delay circuit section without the dummy load circuit 42. During the active time T1, the drive current Is consumed by the delay circuits DM1–DMn flows to the power supply lines Lp, Ln, such that the parasitic resistance of the power supply lines Lp, Ln causes the voltage of the high potential power supply VDD to fluctuate. As a result, the delay time tDP differs between the delay circuits DM1–DMn.

In comparison, the dummy load current Id is consumed by the dummy load circuit 42 (the ON resistance of the NMOS transistors Q42, Q43) during the inactive time T2 in the delay circuit section 41 of the seventh embodiment. The dummy load current Id flows through the ON resistance of the NMOS transistors Q42, Q43, and the ON resistance has a value greater than the parasitic resistance value of the power supply lines Lp, Ln. Accordingly, the dummy load current Id has a relatively high value that is not affected by the parasitic resistance. As a result, the difference between the drive current Is and the dummy load current Id is decreased, and the fluctuation of the high potential power supply VDD caused by parasitic resistance is minimized. As shown in FIG. 27, the delay time tDP of each delay circuit DM1–DMn is substantially the same. The dummy load circuit 42 generates a highly accurate internal clock signal CK and minimizes jitter of the internal clock signal CK.

[Eighth Embodiment]

Figure 29:
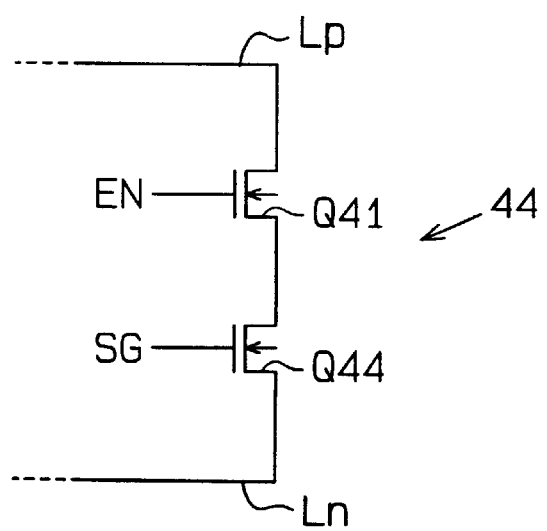
FIG. 29 is a circuit diagram showing a dummy load circuit according to an eighth embodiment of the present invention.

FIG. 29 is a circuit diagram showing a dummy load circuit 44 according to an eighth embodiment of the present invention. The dummy load circuit 44 includes a drive NMOS transistor Q41 and an NMOS transistor Q44, which is connected between the source of the drive NMOS transistor Q41 and the power supply line Ln and functions as a constant current circuit. A current control signal SG is provided to the gate of the NMOS transistor Q44. The current control signal SG is generated by an internal circuit (not shown) of the SDRAM 1 to adjust the drain current (i.e., dummy load current Id) of the NMOS transistor Q44. The adjustment of the dummy load current Id generates a very highly accurate internal clock signal CK and minimizes jitter of the internal clock signal CK.

[Ninth Embodiment]

Figure 30:
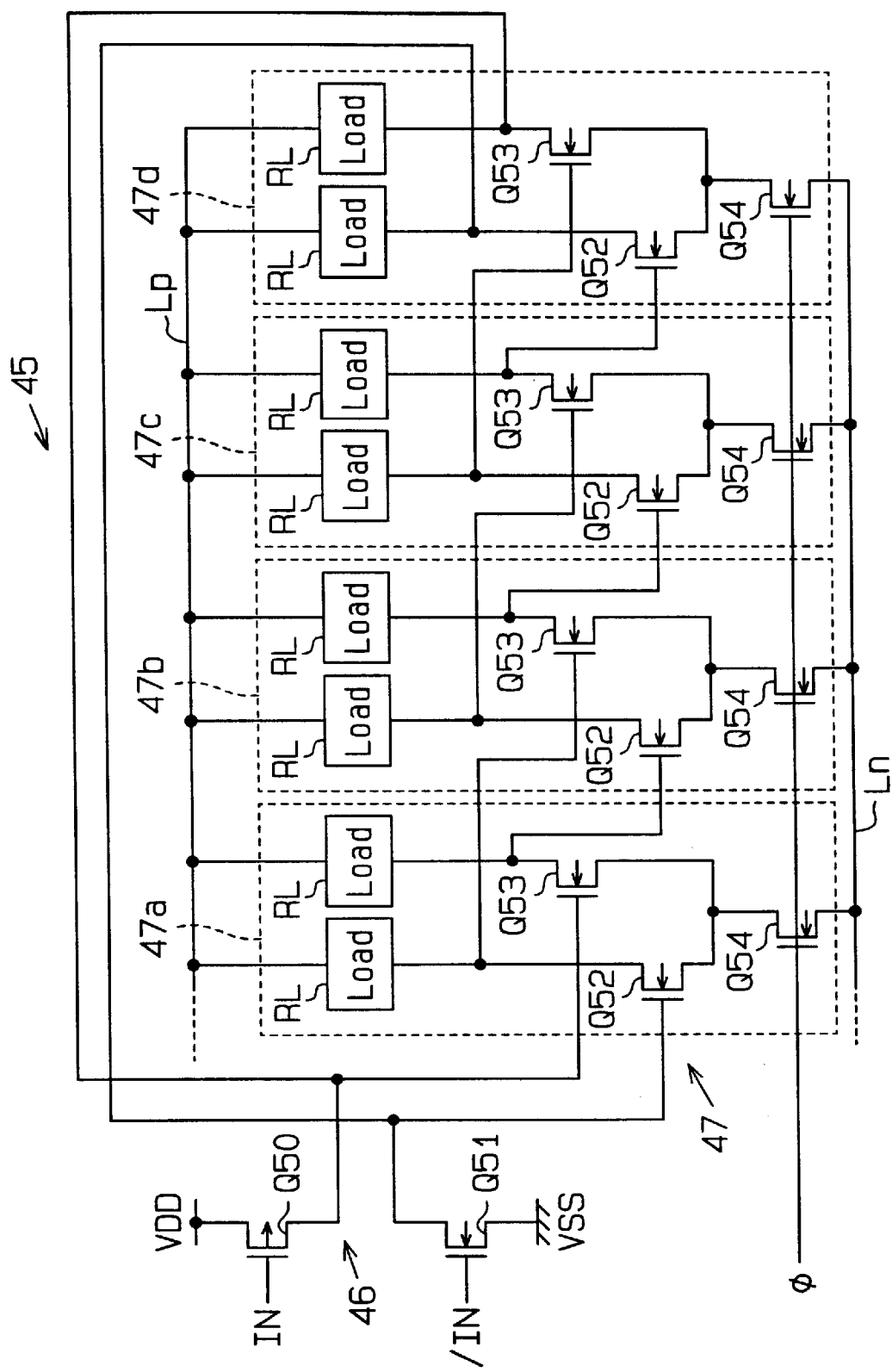
FIG. 30 is a circuit diagram showing a dummy load circuit according to a ninth embodiment of the present invention.

FIG. 30 is a circuit diagram showing a dummy load circuit 45 according to a ninth embodiment of the present invention. The dummy load circuit 45 has an output section 46 and an oscillator section 47. The output section 46 includes a PMOS transistor Q50 and an NMOS transistor Q51. The PMOS transistor Q50 has a source connected to the high potential power supply VDD and a drain connected to the oscillator section 47. The gate of the PMOS transistor Q50 receives a control signal IN. The NMOS transistor Q51 has a source connected to the low potential power supply VSS and a drain connected to the oscillator section 47. The gate of the NMOS transistor Q51 receives a control signal /IN.

During the inactive time T2 of the delay circuit section 41, the control signal /IN is low and the control signal /IN is high. Accordingly, when the final delay circuit DMn outputs an external clock signal CLKn and enters the inactive time T2, the PMOS transistor Q50 and the NMOS transistor Q51 are activated. This causes the PMOS transistor Q50 to send a high output signal and the NMOS transistor Q51 to send a low output signal to the oscillator section 47.

The oscillator section 47 has a plurality of (four in this case) differential inverter circuits 47a–47d. The inverter circuits 47a, 47d each have the same circuit configuration and include differential amplifying transistors Q52, Q53, a constant current NMOS transistor Q54, and two loads RL functioning as resistors. A current mirror circuit that includes PMOS transistors may be used in lieu of the load RL. The gate of the NMOS transistor Q52 in the first inverter circuit 47a is connected to the drain of the NMOS transistor Q53. The gate of the NMOS transistor Q53 in the first inverter 47a is connected to the drain of the NMOS transistor Q50.

The output terminal of the first inverter circuit 47a and the input terminal of the second inverter circuit 47b, the output terminal of the second inverter circuit 47b and the input terminal of the third inverter circuit 47c, and the output terminal of the third inverter circuit 47c and the input terminal of the final inverter circuit 47d are connected so that their phases are the same. The output terminal of the final inverter circuit 47d and the input terminal of the first inverter circuit 47a are connected so that their phases are opposite.

When the first input terminal (the gate of the NMOS transistor Q52) of the first inverter circuit 47a receives a low signal and the input terminal (the gate of the NMOS transistor Q53) receives a high signal, the first and second input terminals of the second inverter circuit 47b respectively receive low and high signals, the phases of which are the same. The same signals are provided until reaching the final inverter circuit 47d. The signal generated by the final inverter circuit 47d is sent to the first inverter circuit 47a. In this state, the last inverter circuit 47d and the first inverter circuit 47a are connected so that their phases are opposite. This reverses the operation of the first inverter circuit 47a, which in turn, reverses the operation of the second inverter circuit 47b. In the same manner, the operation of the other inverter circuits are continued until reaching the final inverter circuit 47d.

An enable signal φ is applied to the gate of each constant current NMOS transistor Q54. The enable signal φ goes high when the delay circuit section 41 enters the inactive time T2 and goes low when the delay circuit section 41 enters the active time T1. The enable signal φ and the control signals IN, /IN are generated by the dummy control circuit 43 (FIG. 25) in accordance with the external clock signals CLK0, CLKn.

When the final delay circuit DMn outputs an external clock signal CLKn and the delay circuit section 41 enters the inactive time T2, the MOS transistors Q50, Q51, Q54 are activated in accordance with the enable signal φ and the control signals IN, /IN and the oscillator section 47 starts oscillation. Accordingly, the dummy load circuit 45 is operated thereby consuming current during the non-operation state T2.

Subsequently, when the first delay circuit DM1 receives the external clock signal CLK0 and the delay circuit section 41 enters the active time T1, the MOS transistors Q50, Q51, Q54 are deactivated in response to the enable signal φ and the control signals IN, /IN and the oscillator section 47 stops oscillation. Accordingly, during the active time T1, the dummy load circuit 45 is deactivated and thus does not consume current. The ninth embodiment generates the internal clock signal CK with high accuracy and minimizes jitter.

It should be apparent to those skilled in the art that the present invention may be embodied in many other specific forms without departing from the spirit or scope of the invention. Particularly, it should be understood that the present invention may be embodied in the following forms.

Figure 31:
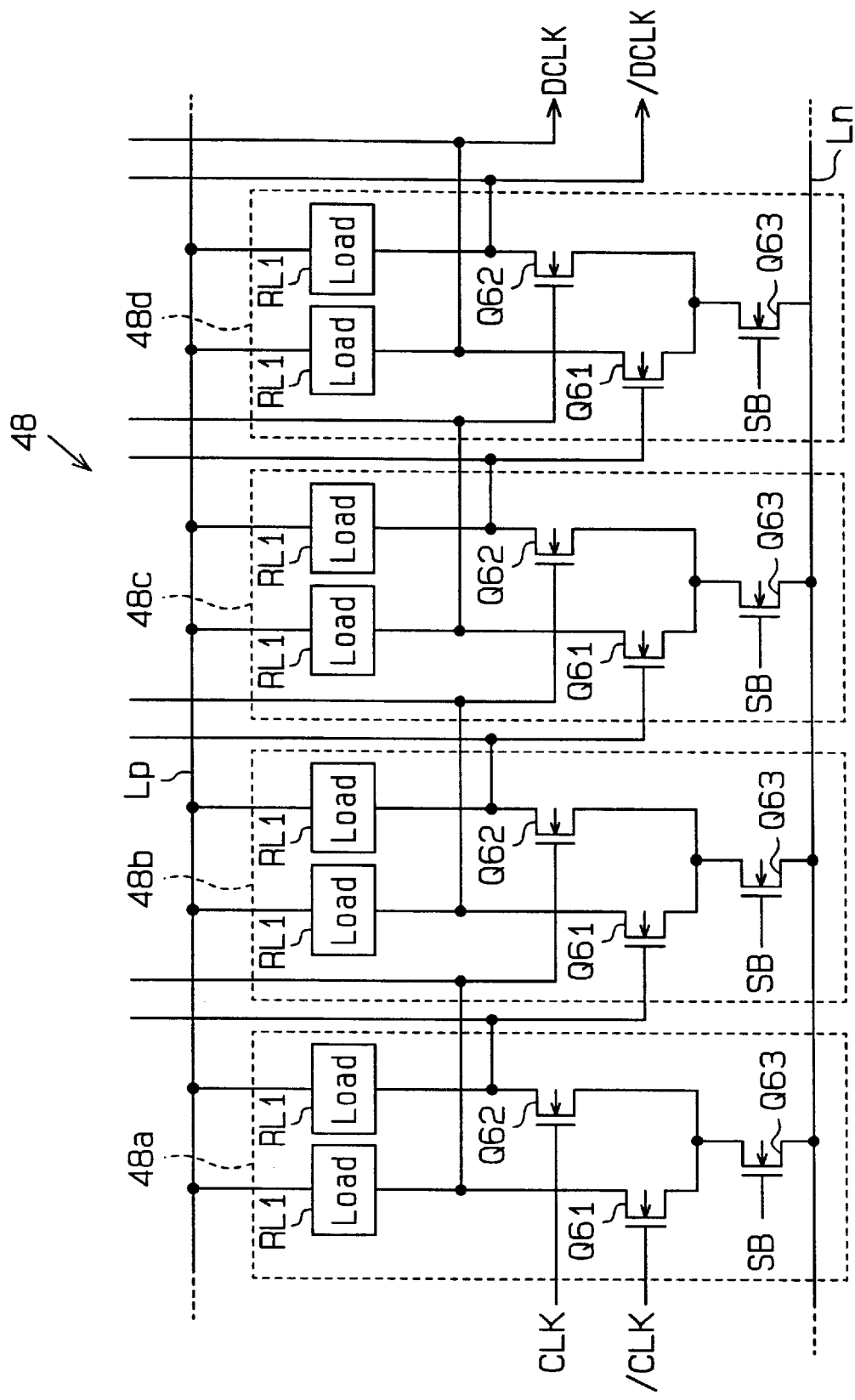
FIG. 31 is a circuit diagram showing a delay circuit section according to a tenth embodiment of the present invention.

(a) The delay circuit sections 3b, 40, 41 may be replaced by a delay circuit section 48 illustrated in FIG. 31. The delay circuit section 48 receives complementary external clock signals CLK, /CLK and generates delayed complementary external clock signals DCLK, /DCLK. The delay circuit section 48 includes delay circuits 48a, 48b, 48c, 48d, (or more, as required), each of which are preferably differential type inverter circuits. Each of the delay circuits 48a, 48b, 48c, 48d includes differential amplifying NMOS transistors Q61, Q62, a constant current NMOS transistor Q63, and two loads RL1 serving as resistors. The output and input terminals of each of the delay circuit 48a, 48b, 48c, 48d are connected so that their phases are the same. The gate of the constant current NMOS transistor Q63 receives a standby signal SB. The load RL1 may be a current mirror circuit that includes a PMOS transistor.

Figure 32:
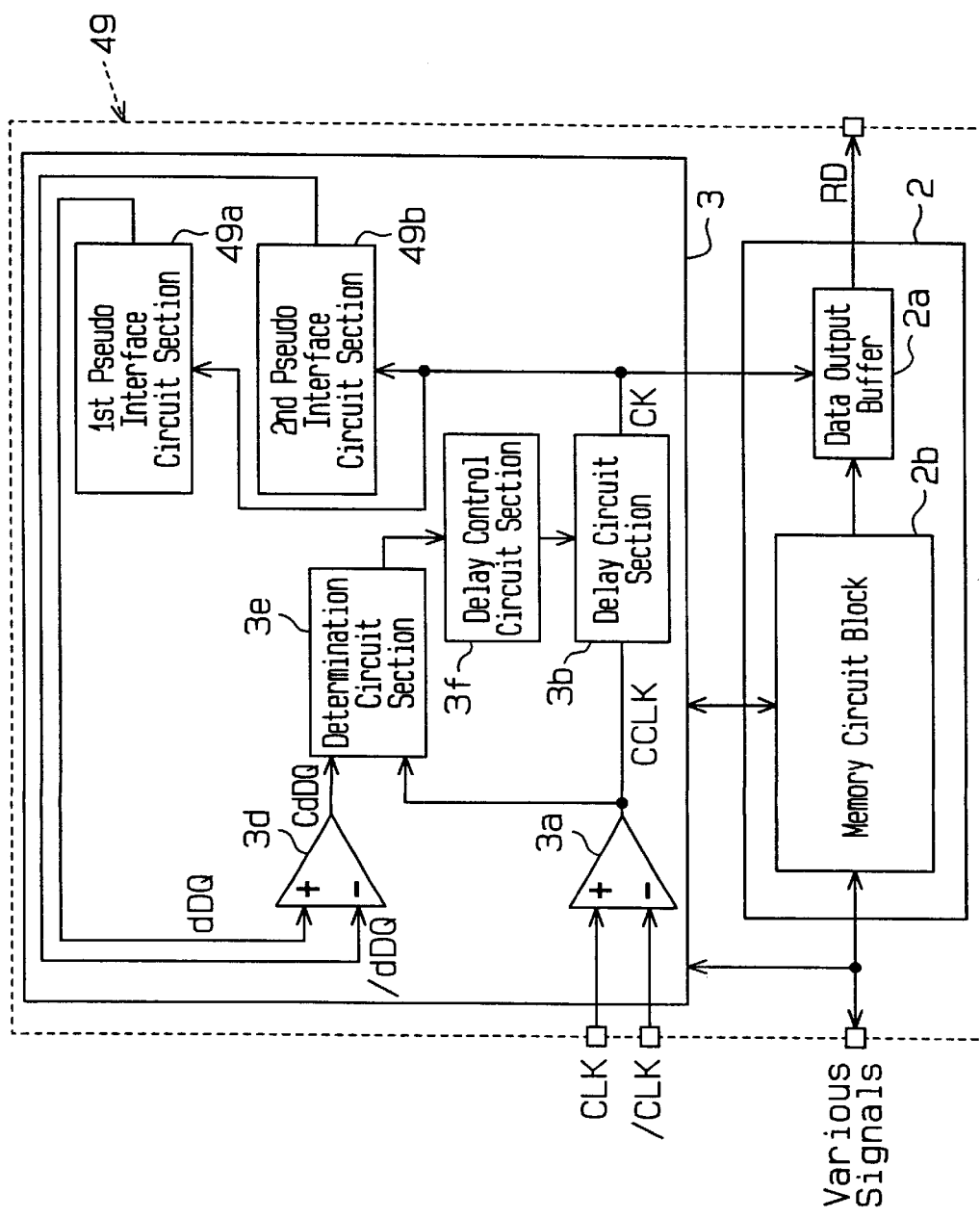
FIG. 32 is a schematic block diagram showing an SDRAM according to an eleventh embodiment of the present invention.

(b) With reference to FIG. 32, the present invention may be applied to an SDRAM 49 having first and second pseudo interface circuits 49a, 49b, which respectively generate complementary pseudo I/O interface signals dDQ, /dDQ. The pseudo signal input buffer 3d compares the complementary pseudo I/O interface signals dDQ, /dDQ and generates a compared pseudo I/O interface signal CdDQ. The clock input buffer 3a compares the complementary external clock signals CLK, /CLK and generates a compared clock signal CCLK.

(c) The timing signal generating circuit embodied as the pseudo interface circuit 3c may be used in a clock signal control circuit other than the DLL circuit 3.

(d) In addition to the pseudo interface circuit 3c, which performs conversion from a CMOS level to a low SST level, the present invention may be applied to a pseudo interface circuit that performs other level conversions.

(e) In the pseudo interface circuit 3c, the PMOS transistor Q21 functioning as the active circuit sets the high level (first level), the resistors R21, R22 functioning as a passive circuit set the low level (second level), and the signal transition accelerating circuit 12 causes quick transition from a high level to a low level. However, this structure may be changed to one in which an active circuit sets the low level, a passive circuit sets the high level, and a signal transition accelerating circuit causes quick transition from a low level to a high level.

(f) The application of the DLL circuit 3 is not limited to the SDRAM 1. The DLL circuit 3 may be applied to other semiconductor memory devices or semiconductor devices.

(g) In addition to the delay circuit sections 3b, 40, 41, the variable delay circuit may be embodied by a clock signal control circuit.

The present examples and embodiments are to be considered as illustrative and not restrictive, and the invention is not to be limited to the details given herein, but may be modified within the scope and equivalence of the appended claims.

What is claimed is:

1. A DLL circuit for generating an internal clock signal, wherein the DLL circuit comprises:
   a determination circuit for comparing a timing signal with an external clock signal to generate a comparison signal;
   a delay circuit for delaying the external clock signal and generating the internal clock signal in accordance with the comparison signal generated by the determination circuit; and
   a pseudo interface circuit for receiving the internal clock signal and generating the timing signal,
   wherein the pseudo interface circuit comprises:
      an active circuit coupled between a high potential power supply and an output node;
      a passive circuit including one or more resistors coupled to the output node; and
      a signal transition accelerating circuit connected to the passive circuit, wherein the output node provides the timing signal.

2. The circuit according to claim 1, wherein the active circuit includes a MOS transistor coupled between the high potential power supply and the output node and the passive circuit includes a resistance dividing circuit comprises resistors.

3. The circuit according to claim 1, wherein the pseudo interface circuit further includes an adjustment circuit connected to the passive circuit.

4. The circuit according to claim 1, wherein the pseudo interface circuit further includes a control circuit connected to the passive circuit to selectively provide the passive circuit with a power supply voltage.

5. The circuit according to claim 4, wherein the control circuit includes a switch connected between the passive circuit and the high potential power supply.

6. The circuit according to claim 4, wherein the control circuit includes a first switch connected between the passive circuit and the high potential power supply, a second switch connected between the passive circuit and a low potential power supply, and an inverter connected between the control terminals of the first and second switches.

7. The circuit according to claim 1, wherein the signal transition accelerating circuit includes a capacitor having a first terminal connected to the active and passive circuits and a second terminal for receiving a discharge enable signal.

8. A semiconductor device coupled to an external interface circuit, the semiconductor device comprising:
   a delay locked loop (DLL) circuit for generating an internal clock signal, wherein the DLL circuit comprises:
      a determination circuit for comparing a timing signal with an external clock signal to generate a comparison signal;
      a delay circuit for delaying the external clock signal and generating the internal clock signal in accordance with the comparison signal generated by the determination circuit; and
      a pseudo interface circuit for receiving the internal clock signal and generating the timing signal,
      wherein the pseudo interface circuit comprises:
         an active circuit coupled between a high potential power supply and an output node;
         a passive circuit including one or more resistors coupled to the output node and;
         a signal transition accelerating circuit connected to the passive circuit wherein the output node provides the timing signal;
   a memory circuit block coupled to the DLL circuit; and
   a data output buffer circuit coupled to the DLL circuit and the memory circuit block,
wherein the data output buffer circuit transmits signal from the memory circuit block in accordance with the internal clock signal to the external interface circuit.

9. The DLL circuit according to claim 8, wherein the active circuit includes a MOS transistor coupled between the high potential power supply and the output node and the passive circuit includes a resistance dividing circuit comprises resistors.

10. The DLL circuit according to claim 9, wherein the pseudo interface circuit further includes an adjustment circuit connected to the passive circuit.

11. The DLL circuit according to claim 8, wherein the pseudo interface circuit further includes a control circuit connected to the passive circuit to selectively provide the passive circuit with a power supply voltage.

12. The DLL circuit according to claim 11, wherein the control circuit includes a switch connected between the passive circuit and the high potential power supply.

13. The DLL circuit according to claim 11, wherein the control circuit includes a first switch connected between the passive circuit and the high potential power supply, a second switch connected between the passive circuit and a low potential power supply, and an inverter connected between the control terminals of the first and second switches.

14. The DLL circuit according to claim 8, wherein the signal transition accelerating circuit includes a capacitor having a first terminal connected to the active and passive circuits and a second terminal for receiving a discharge enable signal.

15. A semiconductor memory device, comprising:
   a delay locked loop (DLL) circuit for generating an internal clock signal, wherein the DLL circuit comprises:
   a determination circuit for comparing a timing signal with an external clock signal to generate a comparison signal;
   a delay circuit for delaying the external clock signal and generating the internal clock signal in accordance with the comparison signal generated by the determination circuit; and
   a pseudo interface circuit for receiving the internal clock signal and generating the timing signal,
   wherein the pseudo interface circuit comprises:
      an active circuit coupled between a high potential power supply and an output node;
      a passive circuit including one or more resistors coupled to the output node; and
      a signal transition accelerating circuit connected to the passive circuit wherein the output node provides the timing signal;
   a memory circuit block coupled to the DLL circuit; and
   a data output buffer circuit coupled to the DLL circuit and the memory circuit block,
   wherein the data output buffer circuit transmits signal from the memory circuit block in accordance with the internal clock signal to the external interface circuit.

16. The device according to claim 15, wherein the active circuit includes a MOS transistor coupled between the high potential power supply and the output node and the passive circuit includes a resistance dividing circuit comprises resistors.

17. The device according to claim 16, wherein the pseudo interface circuit further includes an adjustment circuit connected to the passive circuit.

18. The device according to claim 15, wherein the pseudo interface circuit further includes a control circuit connected to the passive circuit to selectively provide the passive circuit with a power supply voltage.

19. The device according to claim 18, wherein the control circuit includes a switch connected between the passive circuit and the high potential power supply.

20. The device according to claim 18, wherein the control circuit includes a first switch connected between the passive circuit and the high potential power supply, a second switch connected between the passive circuit and a low potential power supply, and an inverter connected between the control terminals of the first and second switches.

21. The device according to claim 15, wherein the signal transition accelerating circuit includes a capacitor having a first terminal connected to the active and passive circuits and a second terminal for receiving a discharge enable signal.

* * * * *